(12) United States Patent
Perego et al.

(10) Patent No.: US 7,526,597 B2
(45) Date of Patent: *Apr. 28, 2009

(54) BUFFERED MEMORY HAVING A CONTROL BUS AND DEDICATED DATA LINES

(75) Inventors: Richard Perego, San Jose, CA (US); Fred Ware, Los Altos Hills, CA (US); Ely Tsern, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/868,242

(22) Filed: Oct. 5, 2007

(65) Prior Publication Data

US 2008/0034130 A1 Feb. 7, 2008

Related U.S. Application Data

(63) Continuation of application No. 10/766,131, filed on Jan. 28, 2004, now Pat. No. 7,363,422, which is a continuation-in-part of application No. 10/272,024, filed on Oct. 15, 2002, now Pat. No. 7,051,151, which is a continuation of application No. 09/479,375, filed on Jan. 5, 2000, now Pat. No. 6,502,161.

(51) Int. Cl.
*G06F 12/00* (2006.01)
(52) U.S. Cl. .............................. 711/5; 711/105; 711/115
(58) Field of Classification Search ........................ None
See application file for complete search history.

(56) References Cited

U.S. PATENT DOCUMENTS 4,621,339 A 11/1986 Wagner et al.
4,631,666 A 12/1986 Harris et al.
4,644,532 A 2/1987 George et al.

(Continued)

FOREIGN PATENT DOCUMENTS

EP 0198429 10/1986

(Continued)

OTHER PUBLICATIONS

Poulton, John., "Signaling in High Performance Memory Systems", IEEE Solid State Circuits Conference, slides 1-59 on 30 pages (Feb. 1999).

(Continued)

*Primary Examiner*—Kevin Verbrugge
(74) *Attorney, Agent, or Firm*—Vierra Magen Marcus & DeNiro LLP

(57) ABSTRACT

A memory system architecture/interconnect topology includes a configurable width buffered module having a configurable width buffer device. The configurable width buffer device is coupled to at least one memory device on the configurable width memory module. The configurable width buffer device includes an interface and a configurable serialization circuit capable of varying a data path width or a number of contacts used at the interface of the configurable width buffer device in accessing the at least one memory device. In an alternate embodiment of the present invention, a multiplexer/demultiplexer circuit is provided. A state storage provides a data width for the configurable width buffer and a SPD provides the configurable width buffer and/or module capabilities to the memory system.

24 Claims, 18 Drawing Sheets

U.S. PATENT DOCUMENTS

| | | | |
|---|---|---|---|
| 4,667,305 A | 5/1987 | Dill et al. |
| 4,747,070 A | 5/1988 | Trottier et al. |
| 4,747,100 A | 5/1988 | Roach et al. |
| 4,858,107 A | 8/1989 | Fedele |
| 4,864,563 A | 9/1989 | Pavey et al. |
| 4,947,257 A | 8/1990 | Fernandez et al. |
| 4,965,799 A | 10/1990 | Green et al. |
| 4,977,498 A | 12/1990 | Rastegar et al. |
| 5,034,917 A | 7/1991 | Bland et al. |
| 5,068,650 A | 11/1991 | Fernandez et al. |
| 5,228,132 A | 7/1993 | Neal et al. |
| 5,228,134 A | 7/1993 | MacWilliams et al. |
| 5,243,703 A | 9/1993 | Farmwald et al. |
| 5,283,877 A | 2/1994 | Gastinel et al. |
| 5,301,278 A | 4/1994 | Bowater et al. |
| 5,307,320 A | 4/1994 | Farrer et al. |
| 5,325,493 A | 6/1994 | Herrell et al. |
| 5,355,467 A | 10/1994 | MacWilliams et al. |
| 5,371,880 A | 12/1994 | Bhattacharya |
| 5,392,407 A | 2/1995 | Heil et al. |
| 5,400,360 A | 3/1995 | Richards et al. |
| 5,408,646 A | 4/1995 | Olnowich et al. |
| 5,432,823 A | 7/1995 | Gasbarro |
| 5,475,818 A | 12/1995 | Molyneaux et al. |
| 5,509,138 A | 4/1996 | Cash et al. |
| 5,511,224 A | 4/1996 | Tran et al. |
| 5,513,135 A | 4/1996 | Dell et al. |
| 5,513,377 A | 4/1996 | Capowski et al. |
| 5,537,394 A | 7/1996 | Abe et al. |
| 5,544,342 A | 8/1996 | Dean |
| 5,553,266 A | 9/1996 | Metzger et al. |
| 5,557,266 A | 9/1996 | Calvignac et al. |
| 5,574,945 A | 11/1996 | Elko et al. |
| 5,602,780 A | 2/1997 | Diem et al. |
| 5,604,735 A | 2/1997 | Levinson et al. |
| 5,606,717 A | 2/1997 | Farmwald et al. |
| 5,630,095 A | 5/1997 | Snyder |
| 5,638,334 A | 6/1997 | Farmwald et al. |
| 5,642,444 A | 6/1997 | Mostafavi |
| 5,644,541 A | 7/1997 | Siu et al. |
| 5,655,113 A | 8/1997 | Leung et al. |
| 5,657,481 A | 8/1997 | Farmwald |
| 5,659,710 A | 8/1997 | Sherman et al. |
| 5,701,313 A | 12/1997 | Purdham |
| 5,701,438 A | 12/1997 | Bains |
| 5,742,840 A | 4/1998 | Hansen et al. |
| 5,748,872 A | 5/1998 | Norman |
| 5,758,056 A | 5/1998 | Barr |
| 5,781,717 A | 7/1998 | Wu et al. |
| 5,787,083 A | 7/1998 | Iwamoto et al. |
| 5,802,054 A | 9/1998 | Bellenger |
| 5,802,565 A | 9/1998 | McBride et al. |
| 5,805,798 A | 9/1998 | Kearns et al. |
| 5,838,603 A | 11/1998 | Mori |
| 5,838,985 A | 11/1998 | Ohki |
| 5,845,108 A | 12/1998 | Yoo et al. |
| 5,848,145 A | 12/1998 | Gallagher et al. |
| 5,860,080 A | 1/1999 | James et al. |
| 5,867,180 A | 2/1999 | Katayama et al. |
| 5,867,422 A | 2/1999 | John |
| 5,883,839 A | 3/1999 | Tosaka et al. |
| 5,884,036 A | 3/1999 | Haley |
| 5,889,726 A | 3/1999 | Jeddeloh |
| 5,893,921 A | 4/1999 | Bucher et al. |
| 5,896,383 A | 4/1999 | Wakeland |
| 5,898,863 A | 4/1999 | Ofer et al. |
| 5,900,017 A | 5/1999 | Genduso et al. |
| 5,901,294 A | 5/1999 | Tran et al. |
| 5,911,052 A | 6/1999 | Singhal et al. |
| 5,913,044 A | 6/1999 | Tran et al. |
| 5,917,760 A | 6/1999 | Millar |
| 5,923,893 A | 7/1999 | Moyer et al. |
| 5,926,839 A | 7/1999 | Katayama |
| 5,953,215 A | 9/1999 | Karabatsos |
| 5,982,238 A | 11/1999 | Soderquist |
| 5,987,576 A | 11/1999 | Johnson et al. |
| 6,006,318 A | 12/1999 | Hansen et al. |
| 6,016,282 A | 1/2000 | Keeth |
| 6,034,878 A | 3/2000 | Osaka et al. |
| 6,038,682 A | 3/2000 | Norman |
| 6,065,092 A | 5/2000 | Roy |
| 6,092,229 A | 7/2000 | Boyle et al. |
| 6,104,417 A | 8/2000 | Nielsen et al. |
| 6,108,731 A | 8/2000 | Suzuki et al. |
| 6,125,419 A | 9/2000 | Umemura et al. |
| 6,142,830 A | 11/2000 | Loeffler |
| 6,151,648 A | 11/2000 | Haq |
| 6,154,821 A | 11/2000 | Barth |
| 6,154,826 A | 11/2000 | Wulf et al. |
| 6,154,855 A | 11/2000 | Norman |
| 6,160,423 A | 12/2000 | Haq |
| 6,185,644 B1 | 2/2001 | Farmwald et al. |
| 6,185,654 B1 | 2/2001 | Van Doren |
| 6,208,273 B1 | 3/2001 | Dye et al. |
| 6,226,723 B1 | 5/2001 | Gustavson et al. |
| 6,247,100 B1 | 6/2001 | Drehmel et al. |
| 6,255,859 B1 | 7/2001 | Haq |
| 6,263,413 B1 | 7/2001 | Motomura et al. |
| 6,263,448 B1 | 7/2001 | Tsern |
| 6,266,252 B1 | 7/2001 | Karabatsos |
| 6,272,609 B1 | 8/2001 | Jeddeloh |
| 6,276,844 B1 | 8/2001 | Coteus et al. |
| 6,292,877 B1 | 9/2001 | Ryan |
| 6,317,352 B1 | 11/2001 | Halbert et al. |
| 6,321,282 B1 | 11/2001 | Horowitz |
| 6,327,205 B1 | 12/2001 | Haq |
| 6,330,667 B1 | 12/2001 | Klein |
| 6,330,687 B1 | 12/2001 | Griffith |
| 6,345,321 B1 | 2/2002 | Litaize et al. |
| 6,349,051 B1 | 2/2002 | Klein |
| 6,369,605 B1 | 4/2002 | Bonella et al. |
| 6,401,167 B1 | 6/2002 | Barth |
| 6,408,402 B1 | 6/2002 | Norman |
| 6,414,868 B1 * | 7/2002 | Wong et al. .................. 365/51 |
| 6,414,904 B2 | 7/2002 | So |
| 6,425,064 B2 | 7/2002 | Soderquist |
| 6,434,035 B2 | 8/2002 | Miersch et al. |
| 6,442,644 B1 | 8/2002 | Gustavson et al. |
| 6,446,158 B1 | 9/2002 | Karabatsos |
| 6,449,213 B1 | 9/2002 | Dodd et al. |
| 6,449,679 B2 | 9/2002 | Ryan |
| 6,449,703 B2 | 9/2002 | Jeddeloh |
| 6,449,727 B1 | 9/2002 | Toda |
| 6,477,592 B1 | 11/2002 | Chen et al. |
| 6,477,614 B1 | 11/2002 | Leddige et al. |
| 6,480,409 B2 | 11/2002 | Park et al. |
| 6,480,927 B1 | 11/2002 | Bauman |
| 6,487,102 B1 | 11/2002 | Halbert et al. |
| 6,493,250 B2 | 12/2002 | Halbert et al. |
| 6,502,161 B1 | 12/2002 | Perego |
| 6,510,503 B2 | 1/2003 | Gillingham et al. |
| 6,510,506 B2 | 1/2003 | Nagapudi et al. |
| 6,513,080 B1 | 1/2003 | Haq |
| 6,513,091 B1 | 1/2003 | Blackmon et al. |
| 6,516,365 B2 | 2/2003 | Horowitz |
| 6,526,469 B1 | 2/2003 | Drehmel et al. |
| 6,530,006 B1 | 3/2003 | Dodd et al. |
| 6,530,033 B1 | 3/2003 | Raynham et al. |
| 6,553,450 B1 | 4/2003 | Dodd et al. |
| 6,557,069 B1 | 4/2003 | Drehmel et al. |
| 6,587,912 B2 | 7/2003 | Leddige et al. |
| 6,604,180 B2 | 8/2003 | Jeddeloh |
| 6,622,224 B1 | 9/2003 | Cloud |
| 6,625,687 B1 | 9/2003 | Halbert et al. |

| | | | |
|---|---|---|---|
| 6,633,947 B1 | 10/2003 | Holman et al. | |
| 6,639,820 B1 | 10/2003 | Khandekar et al. | |
| 6,643,752 B1 | 11/2003 | Donnelly | |
| 6,684,263 B2 | 1/2004 | Horowitz | |
| 6,690,191 B2 | 2/2004 | Wu et al. | |
| 6,690,726 B1 | 2/2004 | Yavits et al. | |
| 6,701,446 B2 | 3/2004 | Tsern | |
| 6,708,248 B1 | 3/2004 | Garrett, Jr. | |
| 6,720,643 B1 | 4/2004 | Fox | |
| 6,754,117 B2 | 6/2004 | Jeddeloh | |
| 6,820,163 B1 | 11/2004 | McCall et al. | |
| 6,842,864 B1 | 1/2005 | Barth | |
| 6,853,938 B2 | 2/2005 | Jeddeloh | |
| 6,854,042 B1 | 2/2005 | Karabatsos | |
| 6,877,079 B2 | 4/2005 | Yoo et al. | |
| 6,889,284 B1 | 5/2005 | Nizar et al. | |
| 6,968,419 B1 | 11/2005 | Holman | |
| 6,970,968 B1 | 11/2005 | Holman | |
| 7,007,130 B1 | 2/2006 | Holman | |
| 7,010,629 B1 | 3/2006 | Frame et al. | |
| 7,110,400 B2 | 9/2006 | Hronik | |
| 2001/0039606 A1 | 11/2001 | Jeddeloh | |
| 2002/0083287 A1 | 6/2002 | Zumkehr et al. | |
| 2002/0112119 A1 | 8/2002 | Halbert et al. | |
| 2002/0124153 A1 | 9/2002 | Litaize et al. | |
| 2002/0144071 A1 | 10/2002 | Williams et al. | |
| 2002/0184462 A1 | 12/2002 | Jeddeloh | |
| 2003/0012229 A1 | 1/2003 | Braun | |
| 2003/0018880 A1 | 1/2003 | Litaize et al. | |
| 2003/0074490 A1 | 4/2003 | Pochmuller | |
| 2003/0120895 A1 | 6/2003 | Litaize et al. | |
| 2004/0015650 A1 | 1/2004 | Zumkehr et al. | |
| 2004/0133736 A1 | 7/2004 | Kyung | |
| 2004/0143773 A1 | 7/2004 | Chen | |
| 2004/0145935 A1 | 7/2004 | Jakobs | |
| 2004/0221106 A1 | 11/2004 | Perego | |
| 2004/0246767 A1 | 12/2004 | Vogt | |
| 2004/0246785 A1 | 12/2004 | Vogt | |
| 2004/0246786 A1 | 12/2004 | Vogt | |
| 2004/0250024 A1 | 12/2004 | Vogt | |
| 2004/0250153 A1 | 12/2004 | Vogt | |
| 2004/0250181 A1 | 12/2004 | Vogt et al. | |
| 2004/0256638 A1 | 12/2004 | Perego | |
| 2004/0257847 A1 | 12/2004 | Matsui et al. | |
| 2004/0260991 A1 | 12/2004 | Vogt et al. | |

FOREIGN PATENT DOCUMENTS

| | | |
|---|---|---|
| EP | 0282070 A2 | 9/1988 |
| EP | 0811916 A2 | 12/1997 |
| EP | 1069509 A2 | 1/2001 |
| GB | 2383656 A | 7/2003 |
| WO | WO9930240 A1 | 6/1999 |
| WO | WO9941666 A1 | 8/1999 |
| WO | WO9941667 A1 | 8/1999 |

OTHER PUBLICATIONS

QBM Alliance, Platform Conference, Quad Band Memory: DDR 200/266/333 devices producing DDR400/533/667, Jan. 23-24, 2002.
John, Lizy Kurian, "VaWiRAM: A Variable Width Random Access Memory Module," 1995 IEEE, 9th International Conference on VLSI Design—1996. pp. 219-224.
Gustavson et al., "The Scalable Coherent Interface Project (Superbus)", SCI Aug. 22, 1988, Draft.
IBM, Micron Technology and Reliance Computer Corporation, DDR SDRAM Registered DIMM Design Specification, Revision 0.6, Nov. 1999, 62 pages.
Nakase, Yasunobu, et al., "Source-Synchronization and Timing Vernier Techniques for 1.2-GB/s SLDRAM Interface," IEEE Journal of Solid-State Circuits, vol. 34, No. 4, Apr. 1999, pp. 494-501.
Minutes of meeting No. 75 JEDEC JC-42.3 Committee on RAM Memories, and referenced attachment "Y" of the presentation titled "SyncLink", May 24, 1995, New Orleans.
Scharke, Marten, "Proposal for Clock Distribution in SCI", SCI, May 5, 1989.
Gustavson, David B., "Scalable Coherent Interface", Nov. 28, 1988, Invited paper presented at COMPCON Spring 89, San Francisco, CA, IEEE pp. 536-538, Feb. 24-Mar. 3, 1989.
Allan, Graham, "DDR SDRAM/SGRAM: An Interpretation of the JEDEC Standard," MOSAID Technologies Inc., Sep. 25, 1998.
IBM, "Application Note DDR SDRAM Module Serial Presence Detect Definitions", Oct. 1999, pp. 1-34.
JEDEC Standard No. 21-C, pp. 4.20-4-1 through 4.20.4-69, 4.20.4-184 Pin, PC1600/2100 DDR SDRAM Registered DIMM Design Specification, Revision 1.2.
Vogt, Pete D. *U.S. Appl. No. 10/714,025, filed Nov. 14, 2003 by Pete D. Vogt.
Paris et al., "WP 24.3: A 800 MB/s 72 Mb SLDRAM with Digitally-Calibrated DLL," ISSCC, 0-7803-5129-0/99, 10 pages. Slide Supplement, IEEE, 1999.
Johnson, B., "Direct RDRAM Basic Architecture and Program Overview", Intel Developer Forum, pp. 1-14, (Sep. 1998).
Microprocessor and Microcomputer Standards Subcommittee of the IEEE Computer Society "Draft Standard for a High-Speed Memory Interface (SyncLink)," Draft 0.99 IEEE P1596.7-199X, pp. 1-66 (1996).
Gillingham, Peter and Vogley, Bill, "SLDRAM: High Performance Open-Standard Memory," IEEE Micro, Nov./Dec. 1997, pp. 29-39, vol. 17, No. 6, Institute of Electrical and Electronics Engineers, Inc., Los Alamitos, California.
"400 Mb/s/pin SLDRAM" Draft/Advance, "4M×18 SLDRAM, Pipelined, Eight Bank, 2.5V Operation." Rev. Jul. 9, 1998, pp. 1-69, Copyright 1998, SLDRAM Inc.
"SLDRAM 400Mb/s/pin Command/Addrss Repeater", SLD10400 Rev. 5, SLDRAM Consortium, pp. 1-12, (Jan. 7, 1998).
Gillingham, Peter, "SLDRAM Architectural and Functional Overview," SLDRAM Consortium, SLDRAM Inc., pp. 1-14 (Aug. 29, 1997).
Vogt, Pete D. U.S. Appl. No. 10/713,868, filed Nov. 14, 2003.
Rambus Inc., "8/9-Mbit (1M×8/9) & 16/18Mbit (2M×8/9) RDRAM—Preliminary Information," Rambus Inc. Data Sheet, Mar. 1, 1996, 30 pages.
IEEE Standard for Scalable Coherent Interface (SCI), "Microprocessor and Microcomputer Standards Subcommittee of the IEEE Computer Society", IEEE Std 1596-1992, Aug. 2, 1993.
Rhoden, DESI Advance Memory International, Inc., Platform99, Standard DRAM Futures and DDR Infrastructures, Jul. 21 & 22, 1999.
The Institute of Electrical and Electronics Engineering, Inc., "IEEE Standard for High-Bandwidth Memory Interface Based on Scalable Coherent Interface SCI Signaling Technology (RamLink)," 1996, pp. 1-99.
"KMM377S1620CT2 SDRAM Module Datasheet", Rev. 1, Preliminary, Samsung Electronics Inc., pp. 1-13, (Nov. 1998).
"Intel 82804AA Memory Repeater Hub for SDRAM (MRH-S)", Datasheet, Intel Corp., pp. 1-48 (Nov. 1999).
Preliminary publication of JEDEC Semiconductor Memory Standards, JEDEC 64 MEG: x4, x8, x16 DDR SDRAM, JEDEC, Aug. 1999.
Vogt, Pete D., U.S. Appl. No. 10/714,026, filed Nov. 14, 2003.
Volz, Richard A. et al., "Position Paper On Global Clock For the Futurebus +", SCI, 1989, 7 pages. (w/status page at end).
Ng, R. (Sun Microsystems Inc.) "Fast computer memories", IEEE Spectrum, Oct. 1992, pp. 36-39.
Kristiansen, E.H., Alnes, Knut, Bakka, Bjorn O, and Jenssen, Mant, "Scalable Coherent Interface", to appear in Eurobus Conference Proceedings, May 1989.
Karabatsos, C., "Quad Band Memory (QBM) Technology", Kentron Technologies, Inc., Apr. 2001.
Jones, F. (United Memories, Inc.) "A new era of fast dynamic RAMs", IEEE Spectrum, Oct. 1992, pp. 43-49.
Gjessing, S. et al., "A RAM link for high speed", IEEE Spectrum, Oct. 1992, pp. 52-53.
Weber, Fred "The AMD Athlon Processor: Future Diections", AMD.
Cataldo, A., "TI Fields DSP-Based Media Processor on a DIMM", EE Times (Jan. 2000).

Rambus Inc., "Direct RDRAM 256/288-Mbit (512Kx16/18x32s)", Aug. 1999, pp. 1-66.

Minutes of Meeting No. 33 JC-16 Committee on Voltage Level and Interface, Mar. 2, 1999, Las Vegas, Nevada.

Mac Williams, Pete, "PC Memory Directions for 1999 and Beyond", Intel Developer Forum, pp. 1-10, (Sep. 1998).

Quad Band Memory (QBM), "The 'QBM Enabled' VIA PT880/PM880 Chipset Solutions with the Fastest Memory".

Micron, 240-Pin 256MB, 1GB DDR2 SDRAM FBDIMM (SR, FBx72) Features, Micron Technology, Inc., 2004, pp. 1-36.

IBM, "184 Pin DIMM Design Updates/Ramifications for Unbuffered and Registered DDR DIMMs," JC-42.5, Dec. 1999, pp. 1-12.

Saltrs, R.H.W. (Phillips Research Laboratories), "Fast DRAMS for sharper TV", IEEE Spectrum, Oct. 1992, pp. 40-42.

Rambus Inc., RDRAM Annotated Specification 4.1-2, 1997.

Micron, 256MB, 512MB, 1GB (x72, ECC, DR) 168-Pin SDRAM RDIMM, Synchronous DRAM Module, Micron Technology, Inc., 2001, pp. 1-28.

Farmwald, M. et al., (Rambus Inc.) "A fast path to one memory", IEEE Spectrum, Oct. 1992, pp. 50-51.

Rambus Inc., "16/18Mbit (2Mx8/9) & 64/72 Mbit (8Mx8/9) Concurrent RDRAM—Advance Information," Rambus Inc. Data Sheet, Jul. 1996, 61 pages.

James, David V., "Scalable I/O Architecture for Buses", COMPCON Spring 1989, SCI, Nov. 28, 1988.

Gustavson, David et al., "Macintosh HD: Desktop Folder: SLDRAM/repeaterConcerns", Sunday, Nov. 23, 1997, 4 pages.

PCT International Search Report PCT/US00/41554, dated Jun. 27, 2001 (4 pages). [RA083.F.PCT].

Rambus Inc. Data Sheet, "16/18Mbit (2M8/9) Concurrent RDRAM", Mar. 1996, pp. 1-33.

Quad Band Memory (QBM), "The 'QBM Enabled' VIA PT880/PM880 Chipset Solutions with the Fastest Memory" (dup of 4483).

"Intel 82805AA Memory Translater Hub (MTH) Datasheet", Intel Corp., pp. 1-48 (Nov. 1999).

Wiggers, H., "SyncLink A Proposal for an Implementation of IEEE P1596.4", Hewlett Packard, pp. 1-20 (Mar. 1995).

Microsoft Press Computer Dictionary, 3rd Ed., 1997, pp. 48 and 68.

Intel Developer Forum, "DDR2 Memory In 2004 Servers—Recipes For Successful Designs", Sep. 2003.

Gibson, Jerry D., Editor-in-Chief, "The Mobile Communications Handbook," copyright 1996 CRC Press, Inc., p. 24.

Doettling et al., "S/390 Parallel Enterprise Server Generation 3: A Balanced System and Cache Structure," IBM J. Res. Develop., vol. 41 (No. 4/5), Jul./Sep. 1997, pp. 405-428.

European Search Report in EP 0 500 1769, dated May 18, 2006, 3 pages.

Excel Spreadsheet, entitled "Patents.xls," available at "http://www.jedec.org/download/search/FBDIMM/patents.xls".

* cited by examiner

| Width | Write | | Read | | Interface 596 |
| --- | --- | --- | --- | --- | --- |
| | $W_A$ | $W_B$ | $R_A$ | $R_B$ | Connections |
| 1 | 1 | 1 | $A_0$ | $A_1$ | 0 |
| 2 | 0 | 1 | 0 | $A_0$ | 0 and 1 |
| 4 | 0 | 0 | 0 | 0 | 3, 2, 1 and 0 |

Fig. 5D

BUFFERED MEMORY HAVING A CONTROL BUS AND DEDICATED DATA LINES

This application is a continuation of U.S. patent application Ser. No. 10/766,131 filed on Jan. 28, 2004 (still pending); which is a continuation-in-part of U.S. patent application Ser. No. 10/272,024 filed on Oct. 15, 2002 (now U.S. Pat. No. 7,051,151); which is a continuation of U.S. patent application Ser. No. 09/479,375 filed on Jan. 5, 2000 (now U.S. Pat. No. 6,502,161).

BACKGROUND OF THE INVENTION

This invention relates to memory systems, memory subsystems, memory modules or a system having memory devices. More specifically, this invention is directed toward memory system architectures that may include integrated circuit devices such as one or more controllers and a plurality of memory devices.

Some contemporary memory system architectures may demonstrate tradeoffs between cost, performance and the ability to upgrade, for example; the total memory capacity of the system. Memory capacity is commonly upgraded via memory modules or cards featuring a connector/socket interface. Often these memory modules are connected to a bus disposed on a backplane to utilize system resources efficiently. System resources include integrated circuit die area, package pins, signal line traces, connectors, backplane board area, just to name a few. In addition to upgradeability, many of these contemporary memory systems also require high throughput for bandwidth intensive applications, such as graphics.

With reference to FIG. 1, a representational block diagram of a conventional memory system employing memory modules is illustrated. Memory system 100 includes memory controller 110 and modules 120a-120c. Controller 110 is coupled to modules 120a-120c via control/address bus 130, data bus 140, and corresponding module control lines 150a-150c. Control/address bus 130 typically comprises a plurality of address lines and control signals (e.g., RAS, CAS and WE).

The address lines and control signals of control/address bus 130 are bussed and "shared" between each of modules 120a-120c to provide row/column addressing and read/write, precharge, refresh commands, etc., to memory devices on a selected one of modules 120a-120c. Individual module control lines 150a-150c are typically dedicated to a corresponding one of modules 120a-120c to select which of modules 120a-120c may utilize the control/address bus 130 and data bus 140 in a memory operation.

Here and in the detailed description to follow, "bus" denotes a plurality of signal lines, each having one or more connection points for "transceiving" (i.e., transmitting or receiving). Each connection point connects or couples to a transceiver (i.e., a transmitter-receiver) or one of a single transmitter or receiver circuit. A connection or coupling is provided electrically, optically, magnetically, by way of quantum entanglement or equivalently thereof.

With further reference to FIG. 1, memory system 100 may provide an upgrade path through the usage of modules 120a-120c. A socket and connector interface may be employed which allows each module to be removed and replaced by a memory module that is faster or includes a higher capacity. Memory system 100 may be configured with unpopulated sockets or less than a full capacity of modules (i.e., empty sockets/connectors) and provided for increased capacity at a later time with memory expansion modules. Since providing a separate group of signals (e.g., address lines and data lines) to each module is avoided using the bussed approach, system resources in memory system 100 are efficiently utilized.

U.S. Pat. No. 5,513,135 discloses a contemporary dual inline memory module (DIMM) having one or more discrete buffer devices.

Examples of contemporary memory systems employing buffered modules are illustrated in FIGS. 2A and 2B. FIG. 2A illustrates a memory system 200 based on a Rambus® channel architecture and FIG. 2B illustrates a memory system 210 based on a Synchronous Link architecture. Both of these systems feature memory modules having buffer devices 250 disposed along multiple transmit/receive connection points of bus 260.

In an upgradeable memory system, such as conventional memory system 100, different memory capacity configurations become possible. Each different memory capacity configuration may present different electrical characteristics to the control/address bus 130. For example, load capacitance along each signal line of the control/address bus 130 may change with two different module capacity configurations. However, using conventional signaling schemes, the bussed approaches lend efficiency towards resource utilization of a system and permits module interfacing for upgradeability.

There is a need for memory system architectures or interconnect topologies that provide flexible and cost effective upgrade capabilities while providing high bandwidth to keep pace with microprocessor operating frequencies.

BRIEF DESCRIPTION OF THE DRAWINGS

In the course of the detailed description to follow, reference will be made to the attached drawings, in which:

FIG. 5D is a table showing control input states to achieve specified data widths in the configurable width buffer device shown in FIG. 5B;

DETAILED DESCRIPTION

Figure 1:
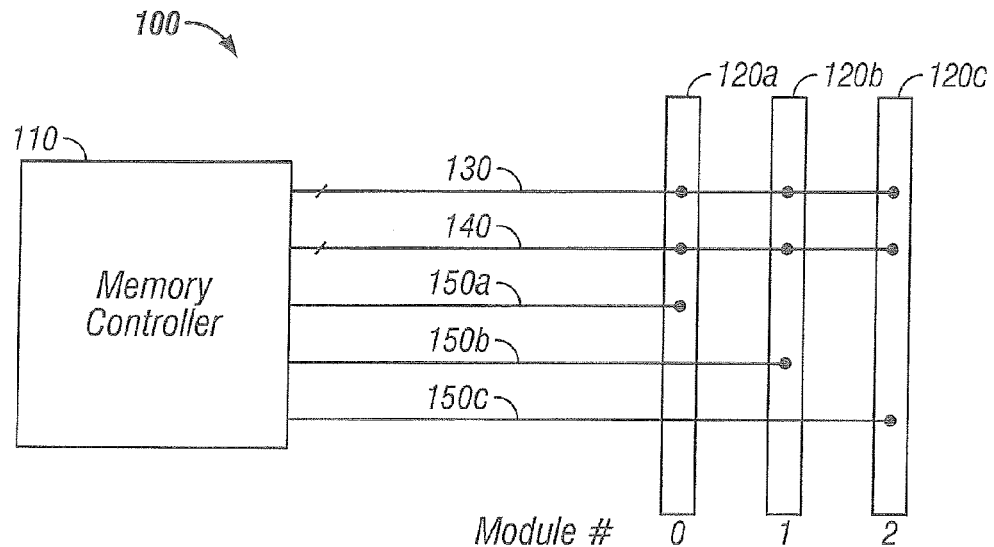
FIG. 1 illustrates a representational block diagram of a conventional memory system employing memory modules.

The present invention relates to a memory system which includes one or more semiconductor memory devices coupled to a buffer device. The buffer device may be disposed on a memory module, housed in a common package along with memory devices, or situated on a motherboard, for example, main memory in a personal computer or server. The buffer device may also be employed in an embedded memory subsystem, for example such as one found on a computer graphics card, video game console or a printer.

In several embodiments, the buffer device provides for flexible system configurations, and several performance benefits. For example, the buffer device may be a configurable width buffer device to provide upgrade flexibility and/or provide high bandwidth among a variety of possible module configurations in the system. A plurality of buffer devices, configurable or otherwise, may be utilized in the memory system to provide high capacity, without compromising performance. A buffer device having configurable width functionality may be employed to allow memory subsystem bandwidth to scale as the system is upgraded or to allow theoretical maximum memory subsystem bandwidth to be achieved among possible memory module configurations. As specified herein, "configurable width" is used to denote that interfacing to the buffer device may be configured in a flexible manner, for example, by configuring how many parallel bits of data may be transferred with the buffer device.

In several embodiments, one or more busses or a plurality of point-to-point links may be used to couple one or more buffer devices to a master (e.g., a controller or microprocessor device). A dynamic point-to-point link topology or any combination of point-to-point links or busses may be used to interface the master device and a corresponding buffer device.

In a specific embodiment, at least one point-to-point link connects at least one memory subsystem to the master, (e.g., a processor or controller). The memory system may be upgraded by coupling memory subsystems to the master via respective dedicated point-to-point links. Each memory subsystem includes a buffer device (e.g., a configurable width buffer device) that communicates to a plurality of memory devices. The master communicates with each buffer device via each point-to-point link. The buffer device may be disposed on a memory module along with the plurality of memory devices and connected to the point-to-point link via a connector. Alternatively, the buffer device may be disposed on a common printed circuit board or backplane link along with the corresponding point-to-point link and master.

"Memory devices" are a common class of integrated circuit devices that have a plurality of storage cells, collectively referred to as a memory array. A memory device stores data (which may be retrieved) associated with a particular address provided, for example, as part of a write or read command. Examples of types of memory devices include dynamic random access memory (DRAM), static random access memory (SRAM), and double data rate SDRAM (DDR). A memory device typically includes request decode and array access logic that, among other functions, decodes request and address information, and controls memory transfers between a memory array and routing path. A memory device includes a transceiver for transmitting and receiving data in an embodiment of the present invention. A transceiver includes a transmitter circuit to output data synchronously with respect to rising and falling edges of a clock signal as well as a receiver circuit in an embodiment of the present invention.

A "memory subsystem" is a plurality of memory devices, which may be interconnected with an integrated circuit device (e.g., a buffer device) providing access between the memory devices and an overall system, for example, a computer system. It should be noted that a memory system is distinct from a memory subsystem in that a memory system may include one or more memory subsystems. A "memory module" or simply just "module" denotes a substrate package housing or structure having a plurality of memory devices employed with a connector interface. For example, a memory module may be included in a single unitary package, as in a "system in package" ("SIP") approach. In one type of SIP approach, the module may include a series of integrated circuit dies (i.e., memory devices and buffer device) stacked on top of one another and coupled via conductive interconnect. Solder balls or wire leads may be employed as the connector interface such that the module may be fixedly attached to a printed circuit board substrate. The connector interface may also be of a physically separable type that includes, for example, male and female portions such that the module is detachable from the rest of the system. Another SIP approach may include a number of memory devices and buffer device disposed, in a two dimensional arrangement, on a common substrate plane and situated inside a single package housing.

It follows from these definitions that a memory module having a buffer device (e.g., having a configurable width) isolating data, control, and address signals of the memory devices from the connector interface may be a memory subsystem. As referred to herein, the term "buffer device" may be interchangeable with "configurable width buffer device", although this does not expressly imply that a "buffer device" must have a "configurable width" feature.

A connector interface as described herein, such as a memory module connector interface, is not limited to physically separable interfaces where a male connector or interface engages a female connector or interface. A connector interface also includes any type of physical interface or connection, such as an interface used in a SIP where leads, solder balls or connections from a memory module are soldered to a circuit board. For example, in the stacked die approach, a number of integrated circuit die (i.e., memory devices and buffer device) may be stacked on top of one another with a substrate forming the base and interface to a memory controller or processor via a ball grid array type of connector interface. As another example, the memory devices and buffer device may be interconnected via a flexible tape interconnect and interface to a controller via one of a ball grid array type connector interface or a physically separable socket type connector interface.

Figure 3A:
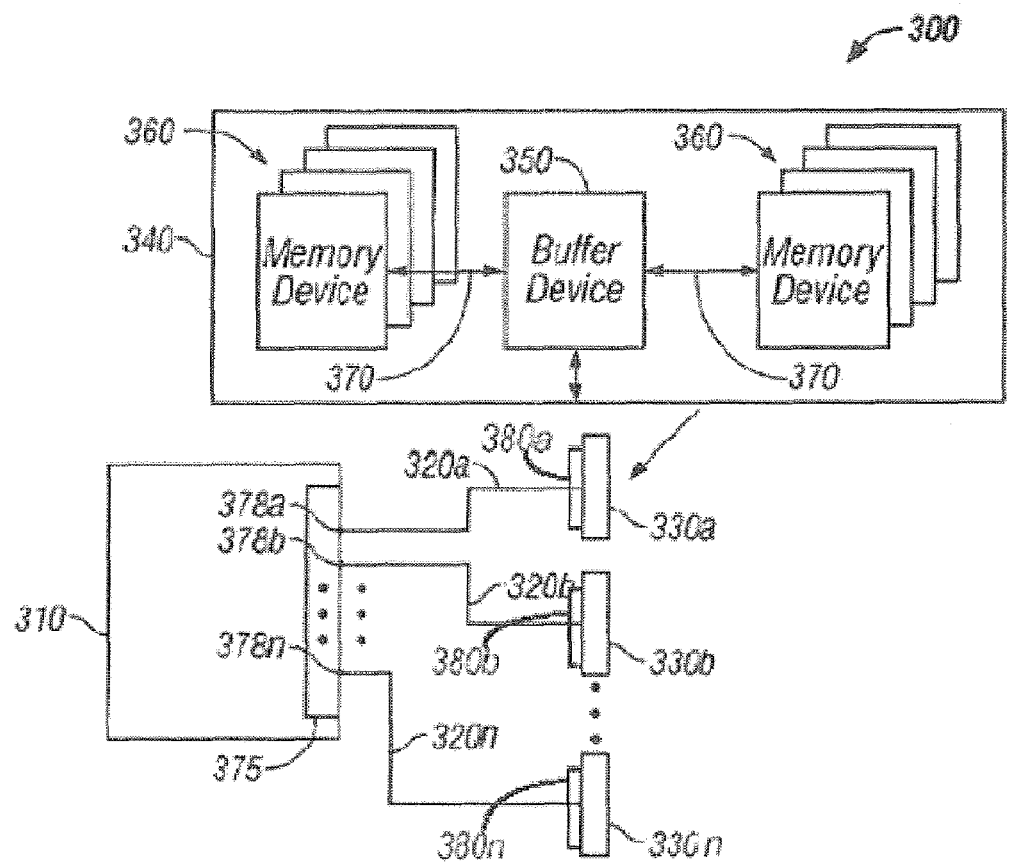
FIGS. 3A, 3B and 9 illustrate a block diagram representing memory systems according to embodiments of the present invention.
Figure 3B:
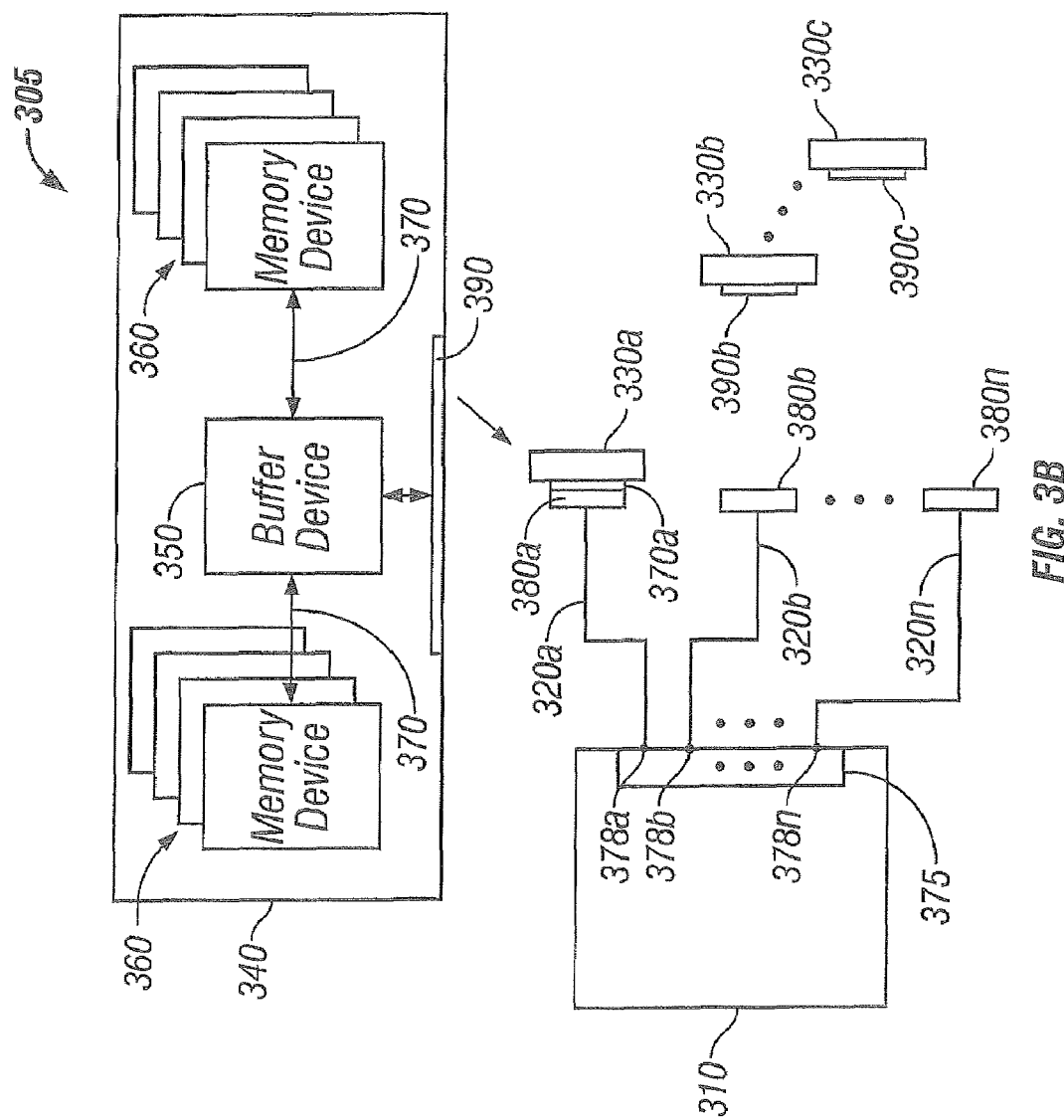
Figure 9:
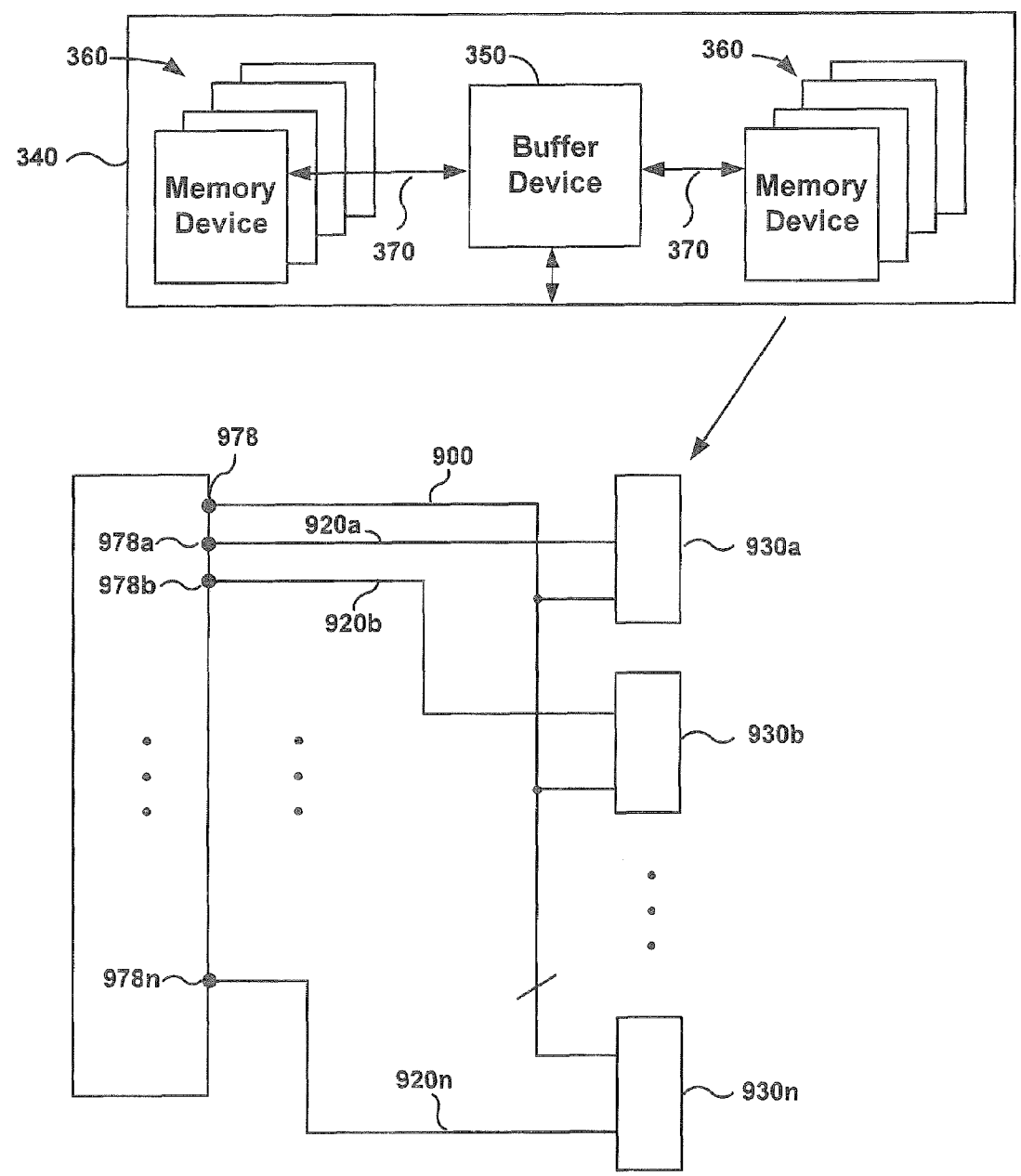

With reference to FIGS. 3A, 3B, and 9 block diagrams of a memory system according to embodiments of the present invention are illustrated. Memory systems 300 and 305 include a controller 310, a plurality of point-to-point links 320*a*-320*n*, and a plurality of memory subsystems 330*a*-330*n*. For simplicity, a more detailed embodiment of memory subsystem 330*a* is illustrated as memory subsystem 340. Buffer device 350 and a plurality of memory devices 360 are disposed on memory subsystem 340. Buffer device 350 is coupled to the plurality of memory devices 360 via channels 370. Interface 375 disposed on controller 310 includes a plurality of memory subsystem ports 378*a*-378*n*. A "port" is a portion of an interface that serves a congruent I/O functionality. The memory subsystem ports 378a-378n may be included as a portion of a configurable width interface, for example as is described in some of the embodiments below.) One of memory subsystem ports 378a-378n includes I/Os, for sending and receiving data, addressing and control information over one of point-to-point links 320a-320n.

According to an embodiment of the present invention, at least one memory subsystem is connected to one memory subsystem port via one point-to-point link. The memory subsystem port is disposed on the memory controller interface, which includes a plurality of memory subsystem ports, each having a connection to a point-to-point link. In other embodiments (e.g., see FIG. 9), memory subsystems 930a-930n are connected to a memory subsystem port 978 via a bus 900 (i.e., a plurality of signal lines). A combination of bus and point-to-point connections may be used to connect the memory subsystem ports 978a-978n to each memory subsystem, for example, point-to-point links 920a-920n may be employed to transport data between the memory subsystem ports 978a-978n and each memory subsystem, and one or more busses may be used to transport control and/or addressing information between the memory subsystem ports 978a-978n and each memory subsystem.

A dynamic point-to-point topology may also be employed to connect the memory subsystem port to each of the memory subsystems. A dynamic point-to-point topology includes a first plurality of point-to-point connections between the memory controller and a first memory module and a second plurality of point-to-point connections between the memory controller and the second memory module in a first configuration. For example, when the second memory module is removed from the system and a second configuration is desired, the plurality of point-to-point connections are routed to the first memory module to retain system bandwidth between memory modules and the controller or increase the bandwidth to the first memory module. The routing may be performed in a number of ways including using a continuity module or switches. In an embodiment, a configurable width buffer device disposed on the first memory module provides the flexibility to configure the width of the first memory module to accept switch between the first and second configurations. That is the configurable width buffer device may provide the flexibility to configure the module to connect to the first plurality of point-to-point connections in the first configuration and to connect to the second plurality of point-to-point links in the second configuration.

In FIG. 3A, point-to-point links 320a-320n, memory subsystems 330a-330c (including mating connectors 380a-n), and controller 310, are incorporated on a common substrate (not shown) such as a wafer or a printed circuit board (PCB) in memory system 300. In an alternate embodiment, memory subsystems are incorporated onto individual substrates (e.g., PCBs). The memory subsystems are then fixedly attached to a single substrate that incorporates point-to-point links 320a-320n and controller 310. In another alternate embodiment illustrated in FIG. 3B, memory subsystems 330a-330c are incorporated onto individual substrates that include connectors 390a-390c to support upgradeability in memory system 305. Corresponding mating connectors 380a-380n are connected to a connection point of each point-to-point link 320a-320n. Each of mating connectors 380a-380n interface with connectors 390a-390c to allow removal/inclusion of memory subsystems 330a-330c in memory system 305. In one embodiment, mating connectors 380a-380n are sockets and connectors 390a-390c are edge connectors disposed on an edge of each memory subsystems 330a-330c. Mating connectors 380a-380n, are attached to a common substrate shared with point-to-point links 320a-320n and controller 310.

With further reference to FIGS. 3A and 3B, buffer device 350 transceives and provides isolation between signals interfacing to controller 310 and signals interfacing to the plurality of memory devices 360. In a normal memory read operation, buffer device 350 receives control, and address information from controller 310 via point-to-point link 320a and in response, transmits corresponding signals to one or more, or all of memory devices 360 via channels 370. One or more of memory devices 360 may respond by transmitting data to Buffer device 350 which receives the data via one or more of channels 370 and in response, transmits corresponding signals to controller 310 via point-to-point link 320a. Controller 310 receives the signals corresponding to the data at corresponding ports 378a-378n. In this embodiment, memory subsystems 330a-330n are buffered modules. By way of comparison, buffers disposed on the conventional DIMM module in U.S. Pat. No. 5,513,135 are employed to buffer or register control signals such as RAS, and CAS, etc., and address signals. Data I/Os of the memory devices disposed on the DIMM are connected directly to the DIMM connector (and ultimately to data lines on an external bus when the DIMM is employed in memory system 100).

Buffer device 350 provides a high degree of system flexibility. New generations of memory devices may be phased in with controller 310 or into memory system 300 by modifying buffer device 350. Backward compatibility with existing generations of memory devices (i.e., memory devices 360) may also be preserved. Similarly, new generations of controllers may be phased in which exploit features of new generations of memory devices while retaining backward compatibility with existing generations of memory devices.

Buffer device 350 effectively reduces the number of loading permutations on the corresponding point-to-point link to one, thus simplifying test procedures. For example, characterization of a point-to-point link may involve aspects such as transmitters and receivers at opposite ends, few to no impedance discontinuities, and relatively short interconnects. By way of contrast, characterization of control/address bus 130 (see FIG. 1) may involve aspects such as multiple transmit and receive points, long stub lines, and multiple load configurations, to name a few. Thus, the increased number of electrical permutations tends to add more complexity to the design, test, verification and validation of memory system 100.

With further reference to FIG. 3B an exemplary system that uses configurable width modules coupled in a dynamic point-to-point configuration may be described. In this exemplary embodiment, each of memory subsystems 330a-330c is a buffered memory module having a configurable width interface. In this embodiment, system capacity may scale without compromising performance when memory modules are added to the system to increase total memory capacity. For example, memory system may be populated with a single buffered memory module located, for example in mating connector 380a (e.g., a socket connector), thus leaving point-to-point links 320b-320n coupled to unpopulated mating connectors 380b-380n. In this configuration, point-to-point links 320b-320n may be routed to access the single buffered memory module located in mating connector 380a and routed using electrical or mechanical switches. The single buffered memory module located in mating connector 380a is programmed to include an interface width that may accommodate the routed point-to-point links 320b-320n. U.S. patent application Ser. No. 09/797,099, (the Upgradeable Application") entitled "Upgradeable Memory System with Reconfigurable Interconnect," filed on Feb. 28, 2001, which application is incorporated by reference herein and which application is assigned to the owner of the present application, describes a configurable memory module that is used in embodiments of the present invention to provide a dynamic point-to-point configuration. In particular, the configurable memory module taught by the Upgradeable Application is used with a configurable buffer device 391, as described below, in embodiments of the present invention. In a point-to-point system, the minimum number of links per memory module is limited by the number of memory devices in a memory module that does not include a buffer device, but can be as low as one link for a memory module having a configurable width buffer device 391. Because memory modules having configurable width buffer devices allow for fewer links per memory module, more memory modules can be supported for a particular number of links from a master device.

Figure 3C:
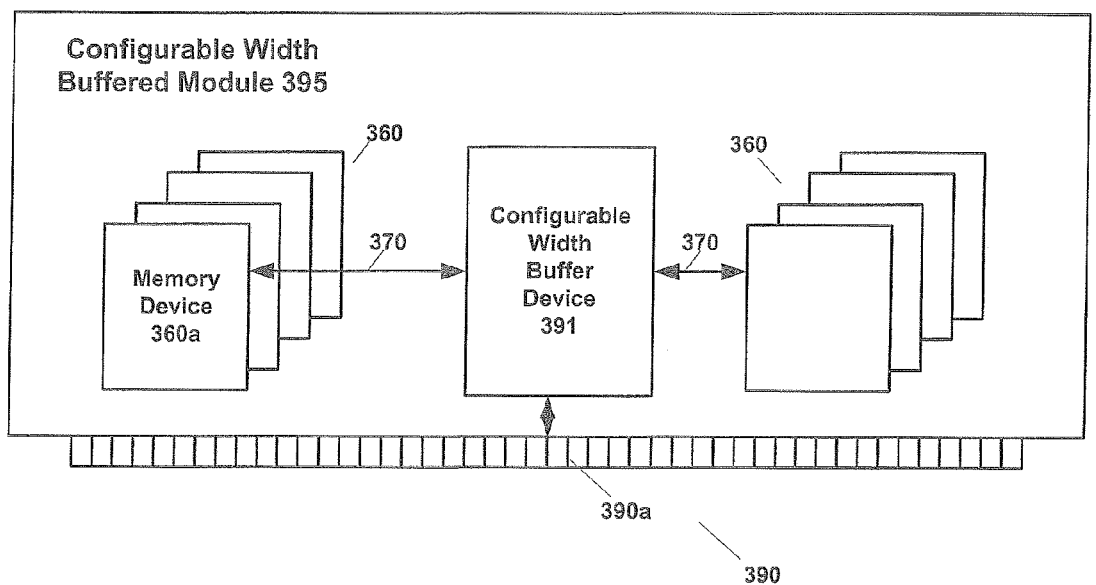
FIG. 3C illustrates a block diagram representing a memory module that includes a configurable width buffer device according to an embodiment of the present invention.

FIG. 3C shows an example of a configurable width buffered module 395 that can be used in conjunction with the system described above. Configurable width buffered module 395 includes memory devices 360, channels 370, configurable width buffer device 391 and connector 390. Configurable width buffered module 395 is configurable or programmable such that information may be transferred using different numbers of interface connections 390a in connector 390 provided by configurable width buffer device 391. In an embodiment of the present invention, interface connections 390a includes a plurality of contacts, conducting elements or pins. In an embodiment illustrated by FIG. 3C, there are four possible configurations for configurable width buffer device 391. As used in the circuit described above, however, each module will be configured in one of two ways: (a) to use its full set of available interface connections 390a, or (b) to use only a limited subset (half in the described example) of its interface connections 390a.

In the following discussion, the modules' alternative configurations, and in particular the configurable width buffer device 391 alternate configurations, are referred to as having or using different "widths". However, it should be noted that the capacities of the memory modules may or may not change with the different data widths, at least in an embodiment of the present invention. A module's full set of data stored on the associated memory devices is available regardless of the buffer interface width being used. With wider interface widths, different subsets of memory devices and memory cells may be accessed through different sets of interface connections. With narrower data or interface widths, the different subsets of memory devices and memory cells are accessed through a common set of interface connections. At such narrower interface widths, larger addressing ranges may be used to access data from one or more of the memory devices.

Configurable width buffered module 395 includes at least one memory device 360a, of memory devices 360, that receive and transmit data bit signals through channels 370 (e.g., a plurality of signal lines). In the described embodiment, memory devices 360 are discretely packaged Synchronous type DRAM integrated circuits (ICs), for example, DDR memory devices, Direct Rambus® memory devices (DRDRAM), or "XDR™" memory devices, although the memory devices might be any of a number of other types, including but not limited to SRAM, FRAM (Ferroelectric RAM), MRAM (Magnetoresistive or Magnetic RAM), Flash, or ROM. singly or in combination.

In the embodiment illustrated in FIG. 3A, buffered modules added to upgrade memory system 300 (e.g., increase memory capacity) are accommodated by independent point-to-point links. Relative to a bussed approach, system level design, verification and validation considerations are reduced, due to the decreased amount of module inter-dependence provided by the independent point-to-point links. Additionally, the implementation, verification and validation of buffered modules may be performed with less reliance on system level environment factors.

Several embodiments of point-to-point links 320a-320n include a plurality of link architectures, signaling options, clocking options and interconnect types. Embodiments having different link architectures include simultaneous bi-directional links, time-multiplexed bi-directional links and multiple unidirectional links. Voltage or current mode signaling may be employed in any of these link architectures.

Clocking methods employed in the synchronization of events in point-to-point link or bussed topologies include any of globally synchronous clocking (i.e., where a single clock frequency source is distributed to various devices in the system); source synchronous clocking (i.e., where data is transported alongside the clock from the source to destination such that the clock and data become skew tolerant) and encoding the data and the clock together. In one embodiment, differential signaling is employed and is transported over differential pair lines. In alternate embodiments, one or more common voltage or current references are employed with respective one or more current/voltage mode level signaling. In yet other embodiments, multi-level signaling-where information is transferred using symbols formed from multiple signal (i.e., voltage/current) levels is employed.

Signaling over point-to-point links 320a-320n or alternatively, over bussed topologies, may incorporate different modulation methods such as non-return to zero (NRZ), multi-level pulse amplitude modulation (PAM), phase shift keying, delay or time modulation, quadrature amplitude modulation (QAM) and Trellis coding. Other signaling methods and apparatus may be employed in point-to-point links 320a-320n, for example, optical fiber based apparatus and methods.

The term "point-to-point link" denotes one or a plurality of signal lines, each signal line having only two transceiver connection points, each transceiver connection point coupled to transmitter circuit, receiver circuit or transceiver circuit. For example, a point-to-point link may include a transmitter coupled at or near one end and a receiver coupled at or near the other end. The point-to-point link may be synonymous and interchangeable with a point-to-point connection or a point-to-point coupling.

In keeping with the above description, the number of transceiver points along a signal line distinguishes between a point-to-point link and a bus. According to the above, the point-to-point link consists of two transceiver connection points while a bus consists of more than two transceiver points.

One or more terminators (e.g., a resistive element) may terminate each signal line in point-to-point links 320a-320n. In several embodiments of the present invention, the terminators are connected to the point-to-point link and situated on buffer device 350, on a memory module substrate and optionally on controller 310 at memory subsystem ports 378a-378n. The terminator(s) connect to a termination voltage, such as ground or a reference voltage. The terminator may be matched to the impedance of each transmission line in point-to-point links 320a-320n, to help reduce voltage reflections. Signal lines of bussed topologies may also benefit from terminating end points or connection points where devices, such as buffer devices connect to those signal lines.

In an embodiment of the present invention employing multi-level PAM signaling, the data rate may be increased without increasing either the system clock frequency or the number of signal lines by employing multiple voltage levels to encode unique sets of consecutive digital values or symbols. That is, each unique combination of consecutive digital symbols may be assigned to a unique voltage level, or pattern of voltage levels. For example, a 4-level PAM scheme may employ four distinct voltage ranges to distinguish between a pair of consecutive digital values or symbols such as 00, 01, 10 and 11. Here, each voltage range would correspond to one of the unique pairs of consecutive symbols.

Figure 4A:
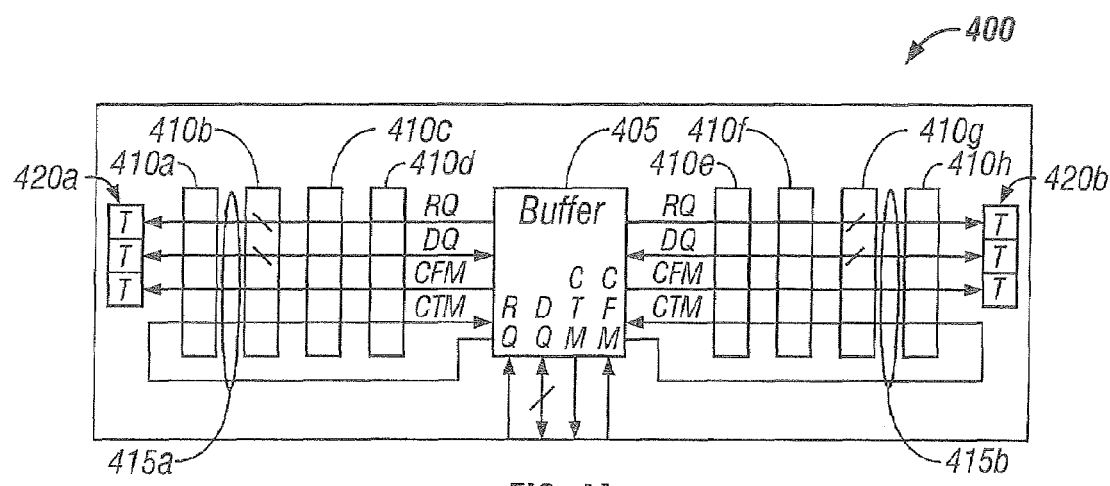
FIGS. 4A, 4B, and 4C illustrate buffered memory modules according to embodiments of the present invention.
Figure 4B:
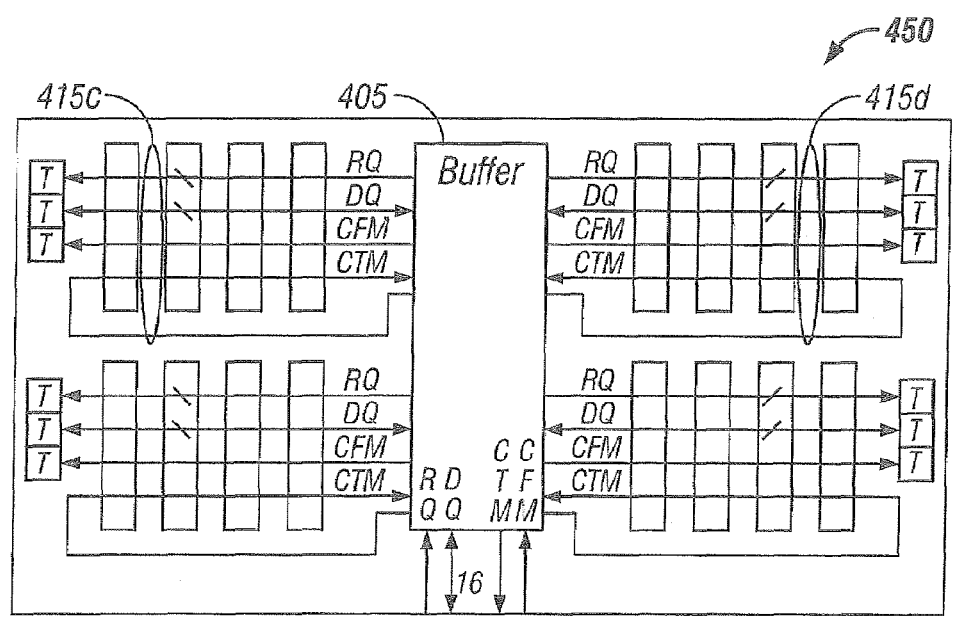
Figure 4C:
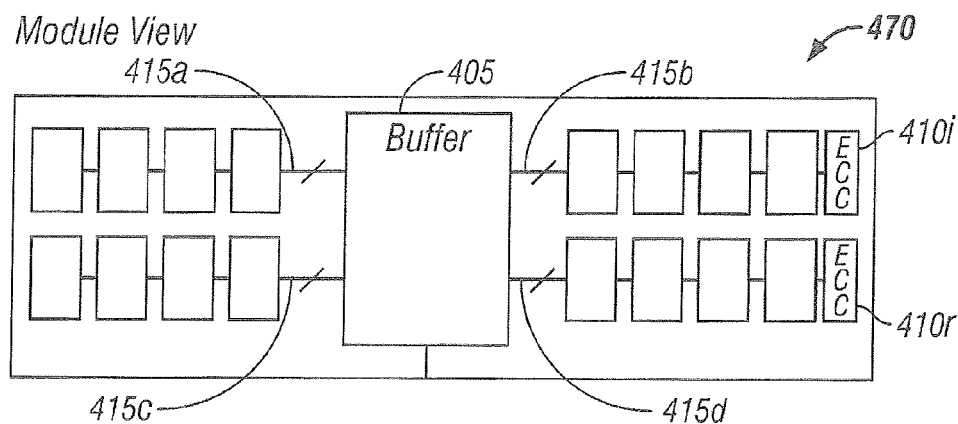

With reference to FIGS. 4A, 4B and 4C, buffered memory modules according to embodiments of the present invention are shown. Modules 400 and 450 include buffer device 405 and a plurality of memory devices 410a-410h communicating over a pair of channels 415a and 415b. In these embodiments channel 415a communicates to memory devices 410a-410d and channel 415b communicates to memory devices 410e-410h.

Figure 2A:
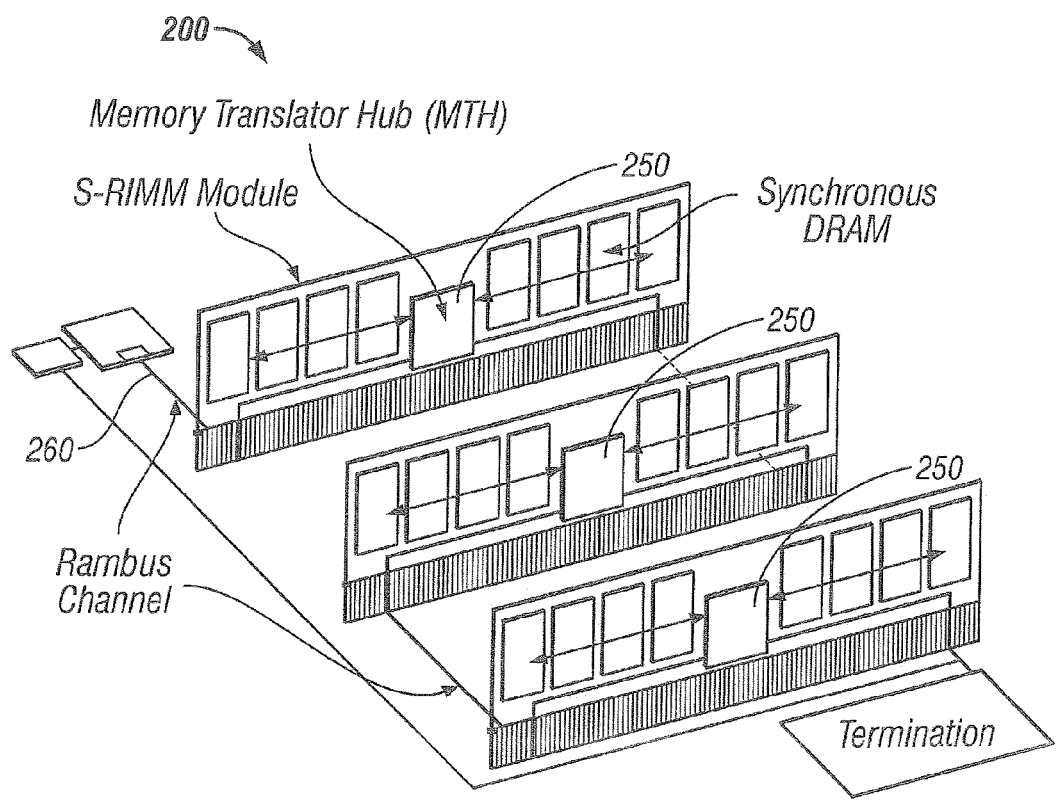
FIGS. 2A and 2B illustrate contemporary memory systems employing buffered modules.
Figure 2B:
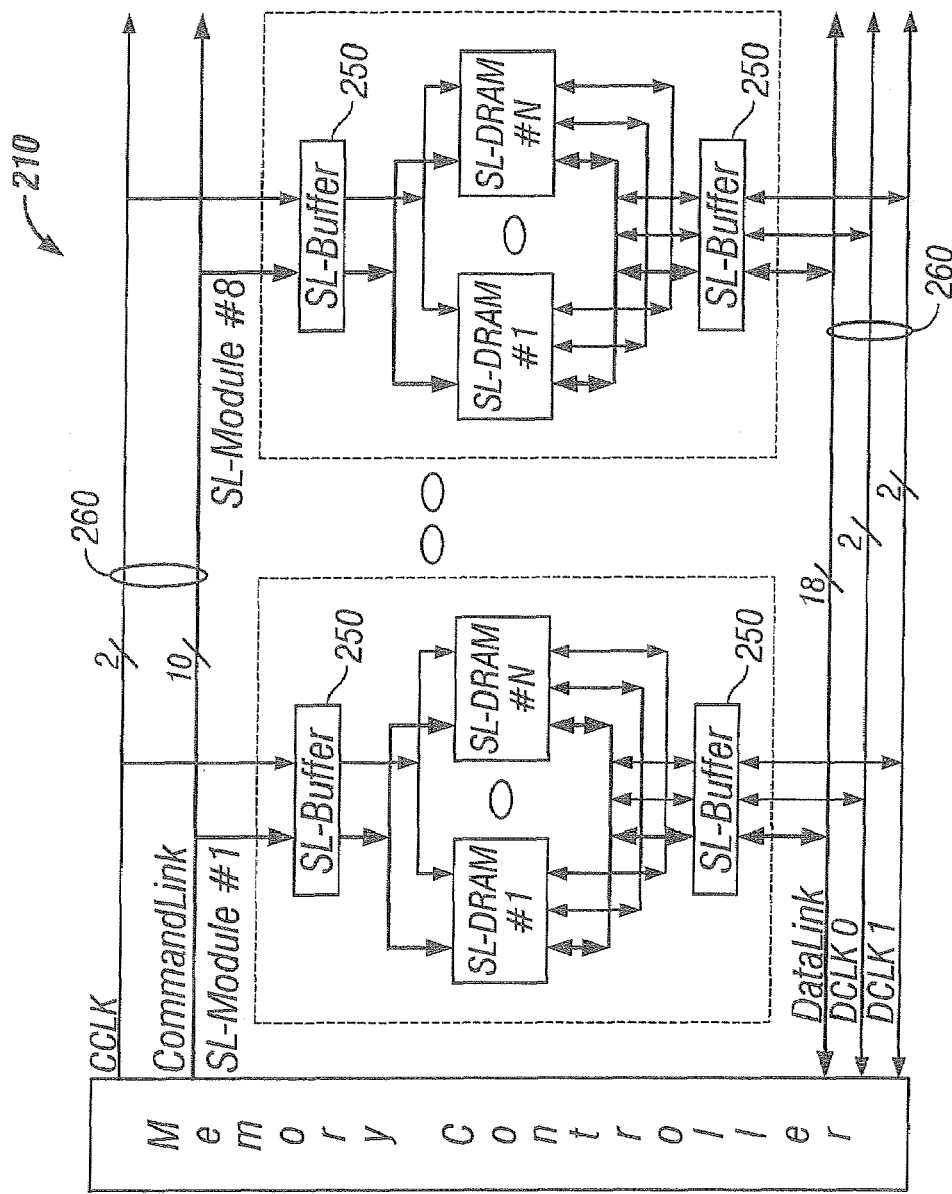

In an embodiment, channels 415a and 415b consist of a plurality of signal lines in a relatively short multi-drop bus implementation. The plurality of signal lines may be controlled impedance transmission lines that are terminated using respective termination elements 420a and 420b. Channels 415a and 415b are relatively short (i.e., are coupled to relatively few memory devices relative to a conventional memory system, for example see FIGS. 2A and 2B) and connect to an I/O interface (not shown) of each memory device via a short stub. Signal lines of channels 415a and 415b include control lines (RQ), data lines (DQ) and clock lines (CFM, CTM). The varieties of interconnect topologies, interconnect types, clocking methods, signaling references, signaling methods, and signaling apparatus described above in reference to point-to-point links 320a-320n may equally apply to channels 415a and 415b.

In accordance with an embodiment of the present invention, control lines (RQ) transport control (e.g., read, write, precharge . . . ) information and address (e.g., row and column) information contained in packets. By bundling control and address information in packets, protocols required to communicate to memory devices 410a-410h are independent of the physical control/address interface implementation.

In alternate embodiments, control lines (RQ) may comprise individual control lines, for example, row address strobe, column address strobe, etc., and address lines. Individual point-to-point control and address lines increase the number of parallel signal connection paths, thereby increasing system layout resource requirements with respect to a narrow "packet protocol" approach. In one alternate embodiment illustrated in FIG. 6A, individual device select lines 633a and 633b are employed to perform device selection. Individual device select lines 633a and 633b decrease some latency consumed by decoding device identification that normally is utilized when multiple devices share the same channel and incorporate individual device identification values.

Clock lines of channels 415a and 415b include a terminated clock-to-master (CTM) (i.e., clock to buffer) and clock-from-master (CFM) (i.e., clock from buffer) line. In a source synchronous clocking method, CTM may be transition or edge aligned with control and/or data communicated to buffer device 405 from one or more of memory devices 410a-410d in, for example, a read operation. CFM may be aligned with or used to synchronize control and/or data from the buffer to memory in, for example, a write operation.

Although two channels 415a and 415b are shown in FIG. 4A, a single channel is also feasible. In other embodiments, more than two channels may be incorporated onto module 400. It is conceivable that if each channel and memory device interface is made narrow enough, then a dedicated channel between each memory device and the buffer device may be implemented on the module. The width of the channel refers to the number of parallel signal paths included in each channel. FIG. 4B illustrates a quad-channel module 450 having channels 415a-415d. In this embodiment, channels 415c and 415d are routed in parallel with channels 415a and 415b to support more memory devices (e.g., 32 memory devices). By incorporating more channels and additional memory devices, module 450 (FIG. 4B) may be implemented in memory systems that require large memory capacity, for example, in server or workstation class systems.

In alternate embodiments, channels 415a and 415b may operate simultaneously with channels 415c and 415d to realize greater bandwidth. By operating a plurality of channels in parallel, the bandwidth of the module may be increased independently of the memory capacity. The advantages of greater bandwidth may be realized in conjunction with larger capacity as more modules incorporated by the memory system 305 (see FIG. 3B) increase the system memory capacity. In other alternate embodiments, the modules are double sided and channels along with corresponding pluralities of memory devices are implemented on both sides. Using both sides of the module increases capacity or increases bandwidth without impacting module height. Both capacity and bandwidth may increase using this approach. Indeed, these techniques may increase capacity and bandwidth singly or in combination.

Other features may also be incorporated to enhance module 400 in high capacity memory systems, for example, additional memory devices and interface signals for error correction code storage and transport (ECC). Referring to FIG. 4C, memory devices 410i and 410r intended for ECC are disposed on module 470.

In one embodiment, memory devices 410a-410h are Rambus® Dynamic Random access Memory (RDRAM) devices operating at a data rate of 1066 Mbits/sec. Other memory devices may be implemented on module 400, for example, Double Data Rate 2 (DDR2) DRAM devices and Synchronous DRAM (SDRAM) devices. Utilizing buffer device 405 between the memory devices and controller in accordance with the present invention (e.g., see FIG. 3) may feasibly render the type of memory device transparent to the system. Different types of memory devices may be included on different modules within a memory system, by employing buffer device 405 to translate protocols employed by controller 310 to the protocol utilized in a particular memory device implementation.

Figure 5A:
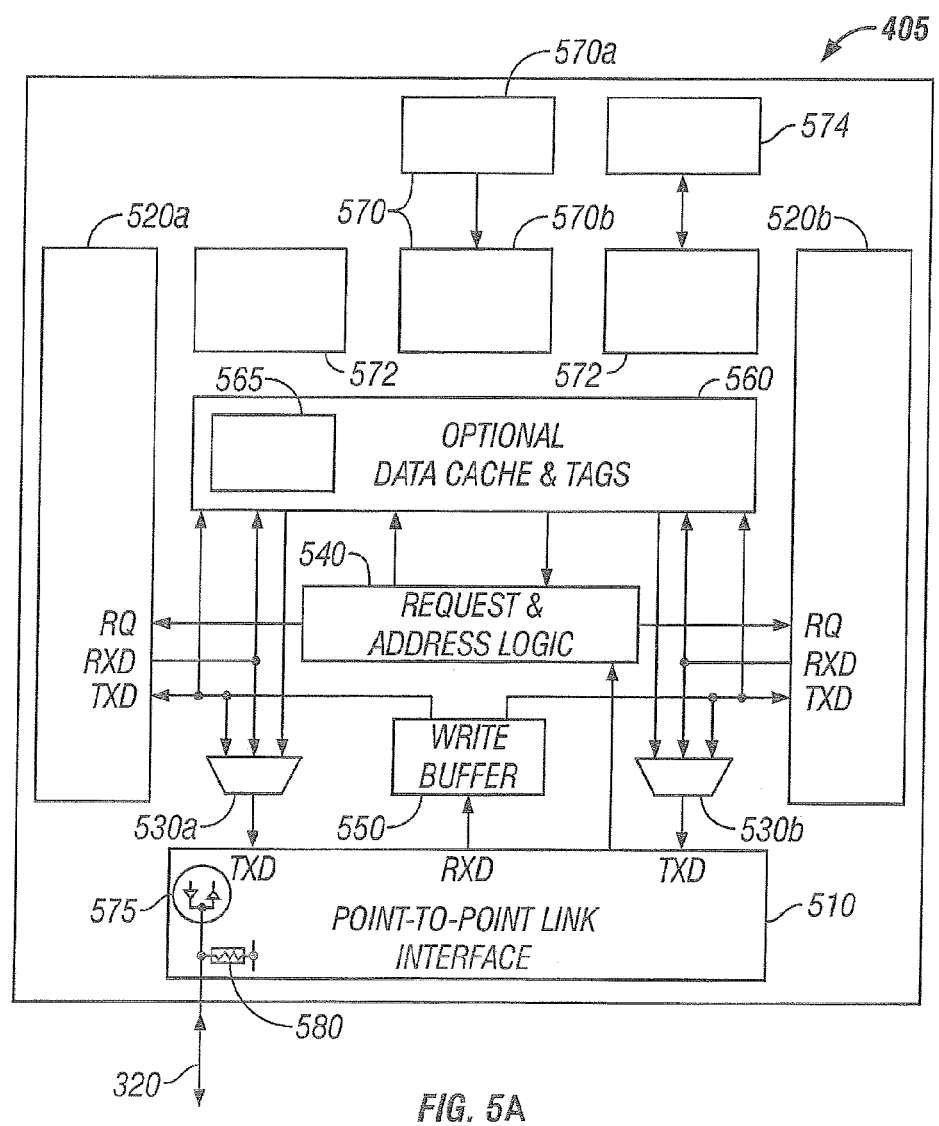
FIG. 5A illustrates a block diagram of a buffer device according to another embodiment of the present invention.

With reference to FIG. 5A, a block diagram of a buffer device according to an embodiment of the present invention is illustrated. Buffer device 405 includes interface 510, interfaces 520a and 520b, multiplexers 530a and 530b, request & address logic 540, write buffer 550, optional cache 560, computation block 565, clock circuit 570a-b and operations circuit 572.

In an embodiment, interface 510 couples to external point-to-point link 320 (e.g., point-to-point links 320a-320n in FIGS. 3A and 3B). Interface 510 includes a port having transceiver 575 (i.e. transmit and receive circuit) that connects to a point-to-point link. Point-to-point link 320 comprises one or a plurality of signal lines, each signal line having no more than two transceiver connection points. One of the two transceiver connection points is included on interface 510. Buffer device 405 may include additional ports to couple additional point-to-point links between buffer device 405 and other buffer devices on other memory modules. These additional ports may be employed to expand memory capacity as is described in more detail below. Buffer device 405 may function as a transceiver between point-to-point link 320 and other point-to-point links. FIGS. 8B and 8C illustrate some buffer-to-buffer connection topology embodiments, while one of ordinary skill in the art would appreciate that there many more embodiments.

In one embodiment, termination 580 is disposed on buffer device 405 and is connected to transceiver 575 and point-to-point link 320. In this embodiment, transceiver 575 includes an output driver and a receiver. Termination 580 may dissipate signal energy reflected (i.e., a voltage reflection) from transceiver 575. Termination 580 may be a resistor or capacitor or inductor, singly or a series/parallel combination thereof. In alternate embodiments, termination 580 may be external to buffer device 405. For example, termination 580 may be disposed on a module substrate or on a memory system substrate.

In another approach, signal energy reflected from transceiver 575 may be utilized in a constructive manner according to an embodiment. By correctly placing a receive point spaced by a distance from the end of point-to-point link 320, a reflected waveform is summed with an incident waveform to achieve a greater signal amplitude. In this approach, layout space may be saved by eliminating termination 580. System power may also be saved using this approach since smaller incident voltage amplitude waveforms may be employed. This approach may be equally applicable to the transceiver end of the point-to-point link, or to channels 415a and 415b (see FIGS. 4A to 4C).

With further reference to FIG. 5A, interfaces 520a and 520b receive and transmit to memory devices disposed on the module (e.g., see FIGS. 4A, 4B and 4C) via channels. Ports included on interfaces 520a and 520b connect to each channel. In alternate embodiments of the present invention, interfaces 520a and 520b include any number of channels e.g., two, four, eight or more channels.

According to an embodiment of the present invention, multiplexers 530a and 530b perform bandwidth-concentrating operations, between interface 510 and interfaces 520a and 520b, as well as route data from an appropriate source (i.e. target a subset of channels, internal data, cache or write buffer). The concept of bandwidth concentration involves combining the (smaller) bandwidth of each channel in a multiple channel embodiment to match the (higher) overall bandwidth utilized in a smaller group of channels. This approach typically utilizes multiplexing and demultiplexing of throughput between the multiple channels and smaller group of channels. In an embodiment, buffer device 405 utilizes the combined bandwidth of interfaces 520a and 520b to match the bandwidth of interface 510. Bandwidth concentration is described in more detail below.

Cache 560 is one performance enhancing feature that may be incorporated onto buffer device 405. Employing a cache 560 may improve memory access time by providing storage of most frequently referenced data and associated tag addresses with lower access latency characteristics than those of the memory devices. Computation block 565 may include a processor or controller unit, a compression/decompression engine, etc, to further enhance the performance and/or functionality of the buffer device. In an embodiment, write buffer 550 may improve interfacing efficiency by utilizing available data transport windows over point-to-point link 320 to receive write data and optional address/mask information. Once received, this information is temporarily stored in write buffer 550 until it is ready to be transferred to at least one memory device over interfaces 520a and 520b.

A serial interface 574 may be employed to couple signals utilized in initialization of module or memory device identification values, test function, set/reset, access latency values, vendor specific functions or calibration. Operations circuit 572 may include registers or a read-only memory (ROM) to store special information (e.g., vendor, memory device parameter or configuration information) that may be used by the controller. Operations circuit may reduce costs by eliminating the need for separate devices on the module conventionally provided to perform these features (e.g., serial presence detect (SPD) employed in some conventional DIMM modules). An SPD device is a non-volatile memory device included on a memory module. The SPD stores information used by the remainder system to properly configure the memory devices upon boot of the system.

According to an embodiment of the present invention, sideband signals are employed to handle special functions such as reset, initialization and power management functions. In addition, sideband signals may be employed to configure the width of the buffer device. Sideband signals are connected via serial interface 574 and are independent from point-to-point link 320 for handling the special functions. In other embodiments sideband signals are independently coupled to memory devices 410a-410h to directly promote initialization, reset, power-up or other functionality independently of buffer device 405. Other interconnect topologies of sideband signals are possible. For example, sideband signals may be daisy chained between buffer devices and coupled to the memory controller or daisy chained between all memory devices to the memory controller. Alternatively, dedicated sideband signals may be employed throughout.

Clock circuit 570a-b may include clock generator circuit (e.g., Direct Rambus® Clock Generator), which may be incorporated onto buffer device 405 and thus may eliminate the need for a separate clock generating device. Here, module or system costs may be decreased since the need for a unique clock generator device on the module or in the system may be eliminated. Since reliability to provide adequate clocking on an external device is eliminated, complexity is reduced since the clock may be generated on the buffer device 405. By way of comparison, some of the conventional DIMM modules require a phase lock loop (PLL) generator device to generate phase aligned clock signals for each memory device disposed on the module.

According to an embodiment of the present invention, clock circuit 570a-b includes one or more clock alignment circuits for phase or delay adjusting internal clock signals with respect to an external clock (not shown). Clock alignment circuit may utilize an external clock from an existing clock generator, or an internal clock generator to provide an internal clock, to generate internal synchronizing clock signals having a predetermined temporal relationship.

Figure 5B:
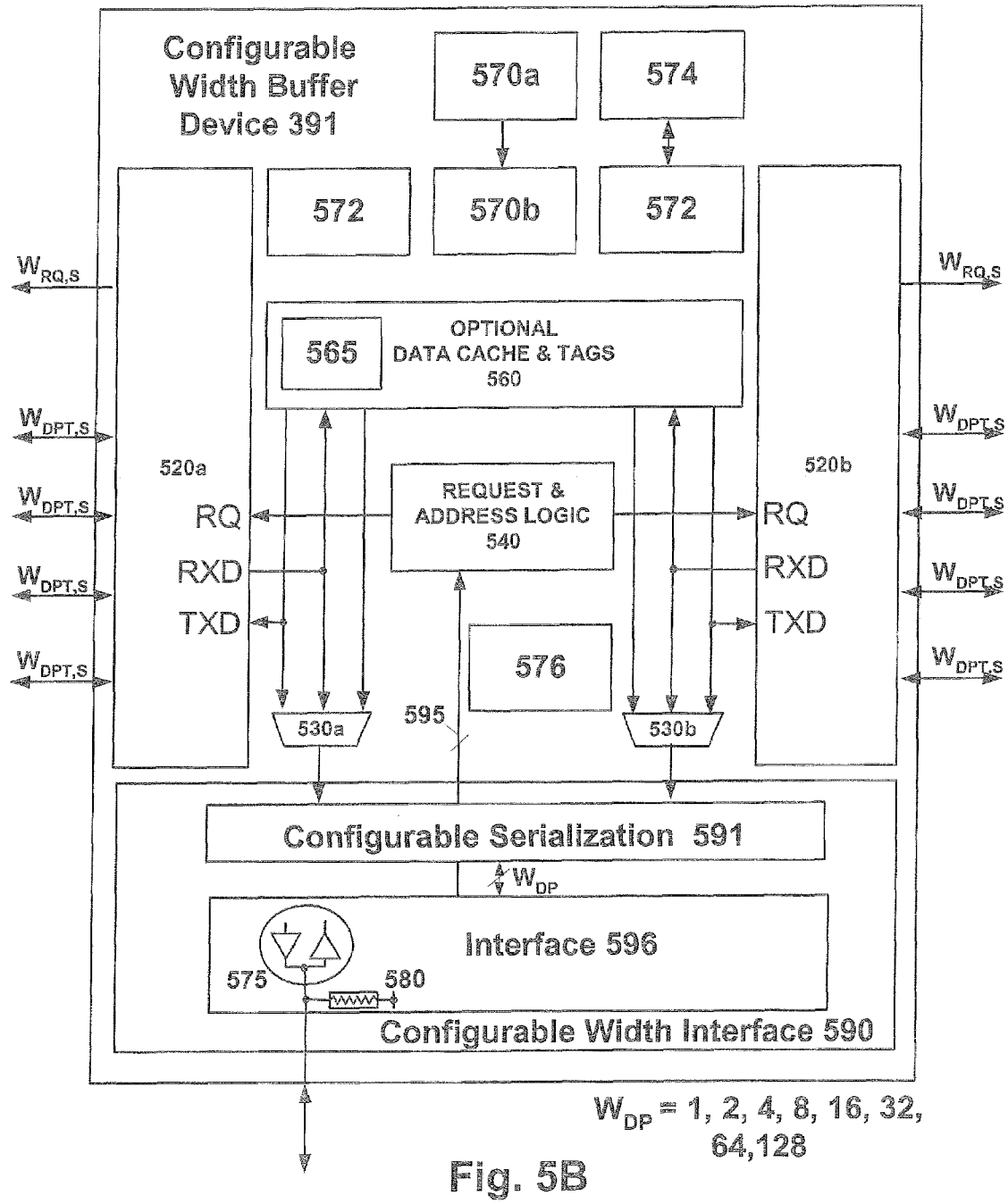
FIG. 5B illustrates a block diagram of a configurable width buffer device according to an embodiment of the present invention.

FIG. 5B illustrates a configurable width buffer device 391 as seen in FIG. 3C in an embodiment of the present invention. Configurable width buffer device 391 includes like numbered components as shown in FIG. 5A and, in an embodiment, may operate as described above. Configurable width buffer device 391 also includes configurable width interface 590, state storage 576, configurable serialization circuit 591 and interface 596. In an embodiment, a plurality of contacts, solder balls or pins are included to provide electrical connections between interface 596 and connector 390 (FIG. 3C) via signal line traces routed on or through out a substrate portion of the module.

Also, in an embodiment of the present invention, one or more transceiver 575 (FIG. 5B) and termination 580 are associated with each port in interface 596. In this specific embodiment, transceiver 575 includes a transmit circuit to transmit data onto a signal line (external to configurable width buffer device 391) and a receiver circuit to receive a data signal on the same signal line. In an alternate embodiment, the transmit circuit is multiplexed with the data received by the receiver circuit. In still a further embodiment of the present invention, the transmit circuit transmits data and the receiver circuit receives data simultaneously.

In another embodiment, the transceiver 575 includes separate unidirectional transmit and receive circuits, each having dedicated resources for communicating data on and off configurable width buffer device 391. In this embodiment, unidirectional transmitter circuit transmits data onto a first signal line disposed on (external to configurable width buffer device 391, for example, disposed on configurable width buffered module 395). In addition, unidirectional receiver circuit receives data from a second signal line.

In another embodiment of the present invention, a transmit circuit transmits a differential signal that includes encoded clock information and a receiver circuit receives a differential signal that includes encoded clock information. In this embodiment, clock and data recovery circuit is included to extract the clock information encoded with the data received by the receiver circuit. Furthermore, clock information is encoded with data transmitted by the transmit circuit. For example, clock information may be encoded onto a data signal, by ensuring that a minimum number of signal transitions occur in a given number of data bits.

In an embodiment of the present invention, any multiplexed combination of control, address information and data intended for memory devices coupled to configurable width buffer device 391 is received via configurable width interface 590, which may, for example extract the address and control information from the data. For example, control information and address information may be decoded and separated from multiplexed data and provided on lines 595 to request & address logic 540 from interface 596. The data may then be provided to configurable serialization circuit 591.

Interfaces 520a and 520b include programmable features in embodiments of the present invention. A number of control lines between configurable width buffer device 391 and memory devices are programmable in order to accommodate different numbers of memory devices on a configurable width buffered module 395 in an embodiment of the present invention. Thus, more dedicated control lines are available with increased memory device memory module configuration. Using programmable dedicated control lines avoids any possible load issues that may occur when using a bus to transfer control signals between memory devices and a configurable width buffer device 391. In another embodiment of the present invention, an additional complement data strobe signal for each byte of each memory device may be programmed at interfaces 520a and 520b to accommodate different types of memory devices on a configurable width memory module 395, such as legacy memory devices that require such a signal. In still a further embodiment of the present invention, interfaces 520a and 520b are programmable to access different memory device widths. For example, interfaces 520a and 520b may be programmed to connect to 16 "x4" width memory devices, 8 "x8" width memory devices or 4 "x16" width memory devices.

Configurable width buffer device 391 has a maximum buffer device interface width equivalent to the number of data pins or contacts provided on the buffer device's package or interface 596. In an embodiment of the present invention, interface 596 includes 128 pins of which selectable subsets of 1, 2, 4, 8, 16, 32, 64 or all 128 pins ($W_{DP}$) may be used in order to configure the width of configurable width buffer device 391. Configurable width buffer device 391 also has a maximum memory device access width defined as the largest number of bits that can be accessed in a single memory device transfer operation to or from configurable width buffer device 391. Using the techniques described herein, the configurable width buffer device 391 may be programmed or configured to operate at interface widths and memory device access widths other than these maximum values.

In an embodiment illustrated by FIG. 5B, a serialization ratio is defined as follows:

$$R_S = W_A : W_{DP}$$

Where:

$R_S$=Serialization Ratio $W_A$=Memory Device Access Width $W_{DP}$=Configured Buffer Device Interface Width For example, if the memory device access width $W_A$ is 128-bits and the configurable width buffer device interface width $W_{DP}$ is 16-bits, the serialization ratio is 8:1. For the described embodiment, the serialization ratio remains constant for all configured buffer device interface widths, so that the memory device access width scales proportionally with configured buffer device interface width. In other embodiments, the serialization ratio could vary as the configured buffer device interface width varies. In other embodiments, the serialization ratio may change and the memory device access width may remain constant.

Configurable serialization circuit 591 performs serialization and deserialization functions depending upon the desired serialization ratio as defined above. As the memory device access width is reduced from its maximum value, memory device access granularity (measured in quanta of data) is commensurately reduced, and an access interleaving or multiplexing scheme may be employed to ensure that all storage locations within memory devices 360 can be accessed. The number of signal lines of channels 370 may be increased or decreased as the memory device access width changes. Channels 370 (FIG. 3C) may be subdivided into several addressable subsets. The address of the transaction will determine which target subset of channels 370 will be utilized for the data transfer portion of the transaction. In addition, the number of transceiver circuits included in interface 520a and 520b that are employed to communicate with one or more memory devices may be configured based on the desired serialization ratio. Typically, configuration of the transceivers may be effectuated by enabling or disabling how many transceivers are active in a given transfer between one or more memory devices and configurable width buffer device 391.

In an embodiment of the present invention, a serialization ratio SR between a primary channel and secondary channels is defined below. In an embodiment of the present invention, communications between primary (e.g. link or bus) and secondary channels (e.g. channel 370 having a plurality of signal lines) have matched bandwidth (i.e. no compression, coding/ECC overhead, or caching).

$$SR = BW_P : BW_S$$

where:

$BW_P$=bandwidth of primary channel (bits/sec/signal line)

$BW_S$=bandwidth of secondary channel (bits/sec/signal line)

The minimum number of secondary channel signal lines required to participate per transaction between primary and secondary channels is:

$$W_{DPT,S} = W_{DP,P} * SR$$

where:

$W_{DP,P}$=programmed data path width for primary channel $W_{DP,S}$=total data path width for secondary channel $W_{DPT,S}$=minimum number of secondary channel signal lines required to participate in each transaction If the total number of secondary channel signal lines per configurable width buffer device 391, $W_{DP,S}$ is greater than the minimum number required per transaction, $W_{DPT,S}$, then configurable width buffer device 391 may employ a configurable datapath router within interface 591 to route requests between the primary channel and the target subset of secondary channel signal lines for each transaction. According to a preferred embodiment, the target subset of secondary channel signal lines may be selected via address bits provided as part of the primary channel request. By accessing a subset of secondary channel signal lines per transaction, a number of benefits may be derived. One of these benefits is reduced power consumption. Another benefit is higher performance by grouping memory devices into multiple independent target subsets (i.e. more independent banks).

Operations circuit 572 (similarly, as described above) is included in configurable width buffer device 391 in an embodiment of the present invention. Operations circuit 572 includes storage circuit to store information used by the system in which the configurable width buffer device 391 is situated in, for example, to perform configuration operations. Alternatively the information may be stored in a serial presence detect device (SPD). Alternatively, the information may be stored in a number of different physical locations, for example, in a register within a controller or a separate integrated circuit on a system motherboard. Operations circuit 572 may store information representing a possible number of configurations of configurable width buffer device 391 and/or configurable width buffered module 395 in embodiments of the present invention. Other information, which may be stored includes, but is not limited to memory device parameters, such as access times, precharge times, setup and hold times, allowable skew times, etc. The functionality of operations circuit 572 may be included on an SPD device for example, an EEPROM device, that is readable by the system, such as a controller, to determine the capabilities of a configurable width buffer device 391 and/or configurable width buffered module 395. A controller can then initialize or set system parameters, such as a data path or interface width, based on the values stored in the SPD device by generating control signals to a control terminal of configurable width buffered module 395. For example, the SPD device may indicate to a controller that configurable width buffer device 391 has a maximum width of 64 as opposed to a maximum width of 128. In an alternate embodiment of the present invention, the SPD device stores a number of serialization ratios, for example, which may be programmed into a register, located on configurable width buffer device 391.

State storage 576 may store a value that is repeatedly programmable or changeable to indicate different buffer device interface widths. The value stored in state storage 576 may be decoded to establish the desired configuration of configurable width interface 590. In addition, state storage may store a plurality of values, for example, a first value that represents the desired width of configurable width interface 590, and a second value that represents the desired width of one or more of interfaces 520a and 520b.

State storage may be programmed upon initialization by a controller device that communicates, to the configurable width buffer device, a value, which corresponds to the width of controller. The configurable width buffer device 391 may also automatically detect what the width of the interface of the controller device is upon power-up and set its own value in state storage 576 accordingly.

In an embodiment of the present invention as illustrated by FIG. 5B, state storage 576 is a programmable register comprising two programmable memory cells, latches, or other mechanisms for storing state information. Within the two cells, two bits are stored. The two bits can represent four different values, through different combinations of bit values (Ex: 00=x1, 01=x2, 10=x4, 11=x8). The different stored values correspond to different programmed buffer device widths. In an embodiment of the present invention, state storage 576 outputs to request & address logic 540 and configurable width interface 590. In FIG. 5B, a state storage 576 is fabricated within each of configurable width buffer device 391. However, state storage 576 can alternatively be located in a number of different physical locations. For example, stage storage 576 might be a register within a memory controller or on a system motherboard. If the storage register is external to configurable width buffer device 391, the width selection information is communicated to configurable width buffer device 391 via electrical signals propagated through module connector 390. In an alternate embodiment of the present invention, a controller transfers width selection information by way of control signals to a control terminal of configurable width buffer device 391.

Various types of state storage are possible. In the described embodiment, the state storage takes the form of a width selection register or latch. This type of state can be easily changed via software during system operation, allowing a high degree of flexibility, and making configuration operations that are transparent to the end user. However, other types of state storage are possible, including but not limited to manual jumper or switch settings and module presence detection or type detection mechanisms. The latter class of mechanisms may employ pull-up or pull-down resistor networks tied to a particular logic level (high or low), which may change state when a module is added or removed from the system.

State storage 576 can be repeatedly programmed and changed during operation of configurable width buffer device 391 to indicate different interface widths. Changing the value or values of state storage 576 changes the interface width of configurable width buffer device 391; even after configurable width buffer device 391 has already been used for a particular width. In general, there is no need to power-down or reset configurable width buffer device 391 when switching between different interface widths, although this may be required due to other factors.

There are many possible ways to implement a state storage 576. Commonly, a register is defined as a state storage 576 that receives a data input and one or more control inputs. The control inputs determine when the storage node within the register will sample the data input. Some time after the register has sampled the input data, which data will appear on the output of the register.

The term register may apply either to a single-bit-wide register or multi-bit-wide register. In general, the number of bits in the width selection register is a function of the number of possible widths supported by the memory device, although there are many possible ways to encode this information.

Figure 5C:
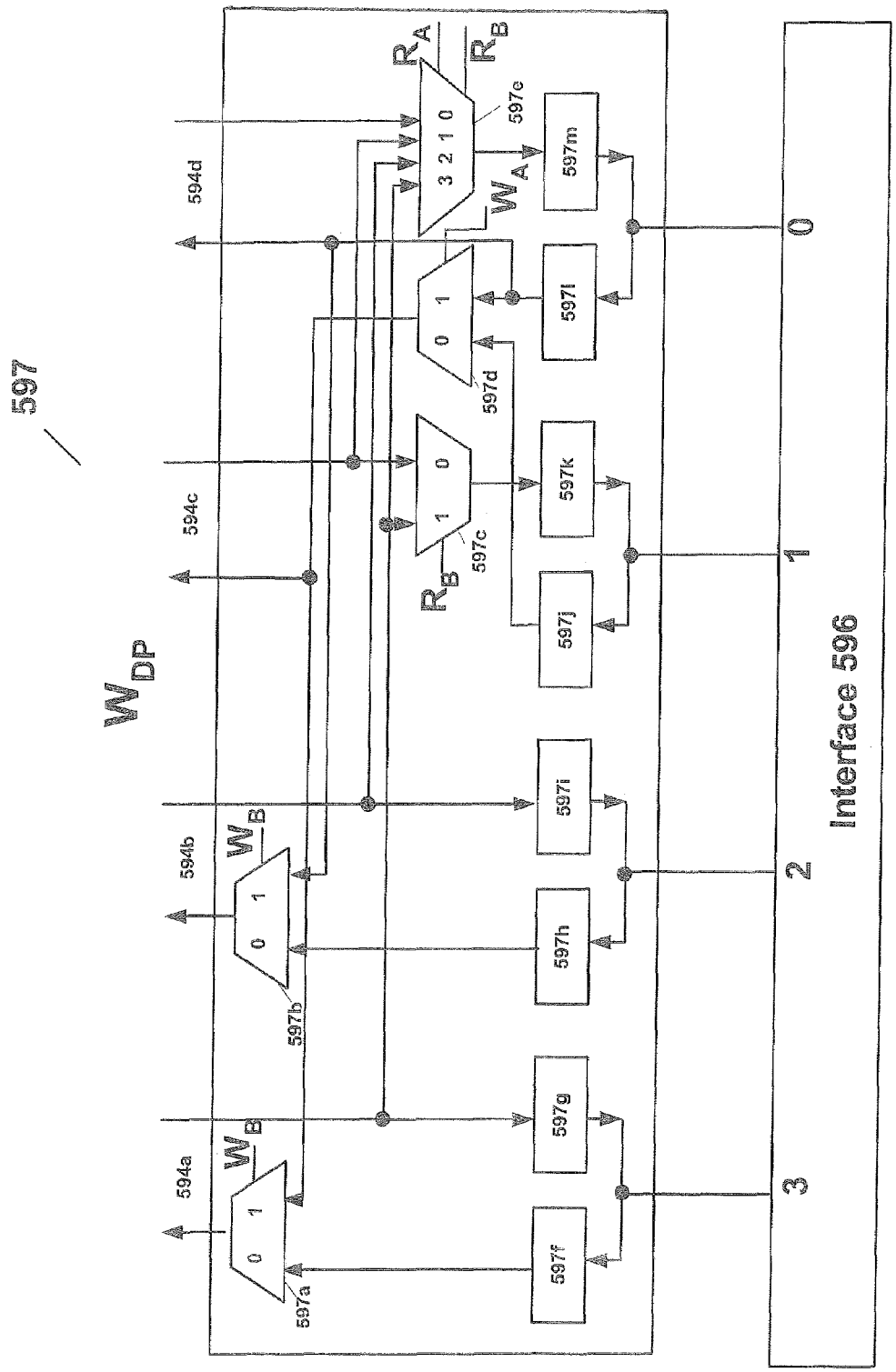
FIG. 5C illustrates a block diagram showing multiplexing and demultiplexing logic used in a configurable width interface of a buffer device shown in FIG. 5B according to an embodiment of the present invention.

FIG. 5C illustrates another embodiment of configurable width interface 590 shown in FIG. 5B. FIG. 5C illustrates a multiplexer/demultiplexer circuit 597, for example that may be disposed in configurable serialization circuit 591 (FIG. 5B) to perform multiplexing/demultiplexing functions. For the embodiment illustrated by FIG. 5C, the serialization ratio is 1:1. Serialization ratios greater than 1:1 are possible with the addition of serial-to-parallel (e.g., during write operations, for data intended to be written to the memory devices) and parallel-to-serial (e.g., during read operations, for data read from the memory device to be provided to the controller device) conversion circuits.

Multiplexer/demultiplexer circuit 597 includes four pairs of read and write data line pairs 594*a-d* coupled, by way of configurable width buffer device 391, to respective memory devices 360. In an alternate embodiment of the present invention, data line pairs 594*a-d* are coupled to a memory array in a memory device 360*a* by way of configurable width buffer device 391.

Generally, multiplexer/demultiplexer circuit 597 contains multiplexing logic and demultiplexing logic. The multiplexing logic is used during read operations, and the demultiplexing logic is used during write operations. The multiplexing logic and demultiplexing logic are designed to allow one, two, or four (0-3) buffer device connections or pins in interface 596 to be routed to memory devices, and in particular individual memory cells.

In the one-bit wide configuration, buffer device data connection 0 can be routed to/from any of the four data line pairs 594*a-d*, which may be coupled to respective memory devices or memory cells in a memory device. In the 2-bit wide configuration, buffer device data connections 0 and 1 can be routed to/from data line pairs 594*a-b* or 594*c-d*, respectively. In the 4-bit wide configuration, buffer device data connections 0, 1, 2, and 3 route straight through to/from data line pairs 594*a-d*, respectively.

Likewise, further data paths may be constructed to couple greater than four configurable width buffer device 391 data connections in an embodiment of the present invention.

Multiplexer/demultiplexer circuit 597 includes input and output latches 597*f-m*, two for each configurable width buffer device data connection in interface 596. Multiplexer/demultiplexer circuit 597 also comprises five multiplexers 597*a-e*. Multiplexers 597*a-d* are two-input multiplexers controlled by a single control input. Multiplexer 597*e* is a four input multiplexer controlled by two control inputs.

Multiplexer/demultiplexer circuit 597 is configured to use two write control signals $W_A$ and $W_B$, and two read control signals $R_A$ and $R_B$. These signals control multiplexers 597*a-e*. They are based on the selected data path width and bits of the requested memory address or transfer phase (see FIG. 5D, described below). State storage 576 (FIG. 5B) produces these signals in response to the programmed data width, whether the operation is a read or write operation, and appropriate addressing information.

FIG. 5D shows the control values used for data path widths of one, two, and four. FIG. 5D also indicates which of interface 596 connections are used for each data width.

When a width of one is selected during a read operation, the circuit allows data from any one of the four data line pairs 594*a-d* (in particular, the read line) to be presented at interface 596 connection 0. Control inputs $R_A$ and $R_B$ determine which of data bit signals will be presented at any given time. $R_A$ and $R_B$ are set (at this data width) to equal the least significant two bits ($A_1$, $A_0$) of the memory address corresponding to the current read operation.

When a width of one is selected during a write operation, the circuit accepts the data bit signal from interface 596 data connection 0 and routes it to all of the four data line pairs 594*a-d* (in particular, the write lines), simultaneously. Control inputs $W_A$ and $W_B$ are both set to a logical value of one to produce this routing.

When a width of two is selected during a read operation, the circuit allows any two of the four data bit signals associated with data line pairs 594*a-d* (in particular, the read lines) to be present at interface 596 connections 0 and 1. To obtain this result, $R_A$ is set to 0, and $R_B$ is equal to the lower bit ($A_0$) of the memory address corresponding to the current read operation. $R_B$ determines which of two pairs of data bit signals (594*a* and 594*b* or 594*c* and 594*d*) are presented at interface 596 connections 0 and 1 during any given read operation.

When a width of two is selected during a write operation, the circuit accepts the data bit signals from interface 596 connections 0 and 1, and routes them either to data line pairs 594*a* and 594*b* (in particular, write lines), or to data line pairs 594*c* and 594*d* (in particular, write lines). $W_A$ and $W_B$ are set to 0 and 1, respectively, to obtain this result.

When a width of four is selected by setting all of the control inputs ($R_A$, $R_B$, $W_A$, and $W_B$) to 0, read and write data signals are passed directly between data line pairs 594*a-d* and corresponding interface 596 data connections 3-0.

The circuit of FIG. 5C is just one example out of many possible embodiments of the present invention. At the expense of increased logic and wiring complexity, an embodiment of the present invention uses a more elaborate crossbar-type scheme that could potentially route any single data bit signal to any data pair line or to any of the interface 596 data connections. In still further embodiments of the present invention, the number and width of memory devices, number of buffer device data connections per buffer device, serialization ratios, and width of data paths may be varied, singly or in combination, from the exemplary numbers and widths provided in describing particular embodiments of the present invention.

In embodiments of the present invention, a master device, such as memory controller 110, includes configurable width interface 590, as described herein, to access at least one configurable width buffered module.

In embodiments of the present invention, interfaces 520*a* and 520*b* include multiplexer/demultiplexer circuit 597, also known as a type of partial crossbar circuit, for transferring signals between configurable width buffer device 391 and memory devices on configurable width buffered module 395. In an alternate embodiment of the present invention, a full crossbar circuit is used.

Figure 5E:
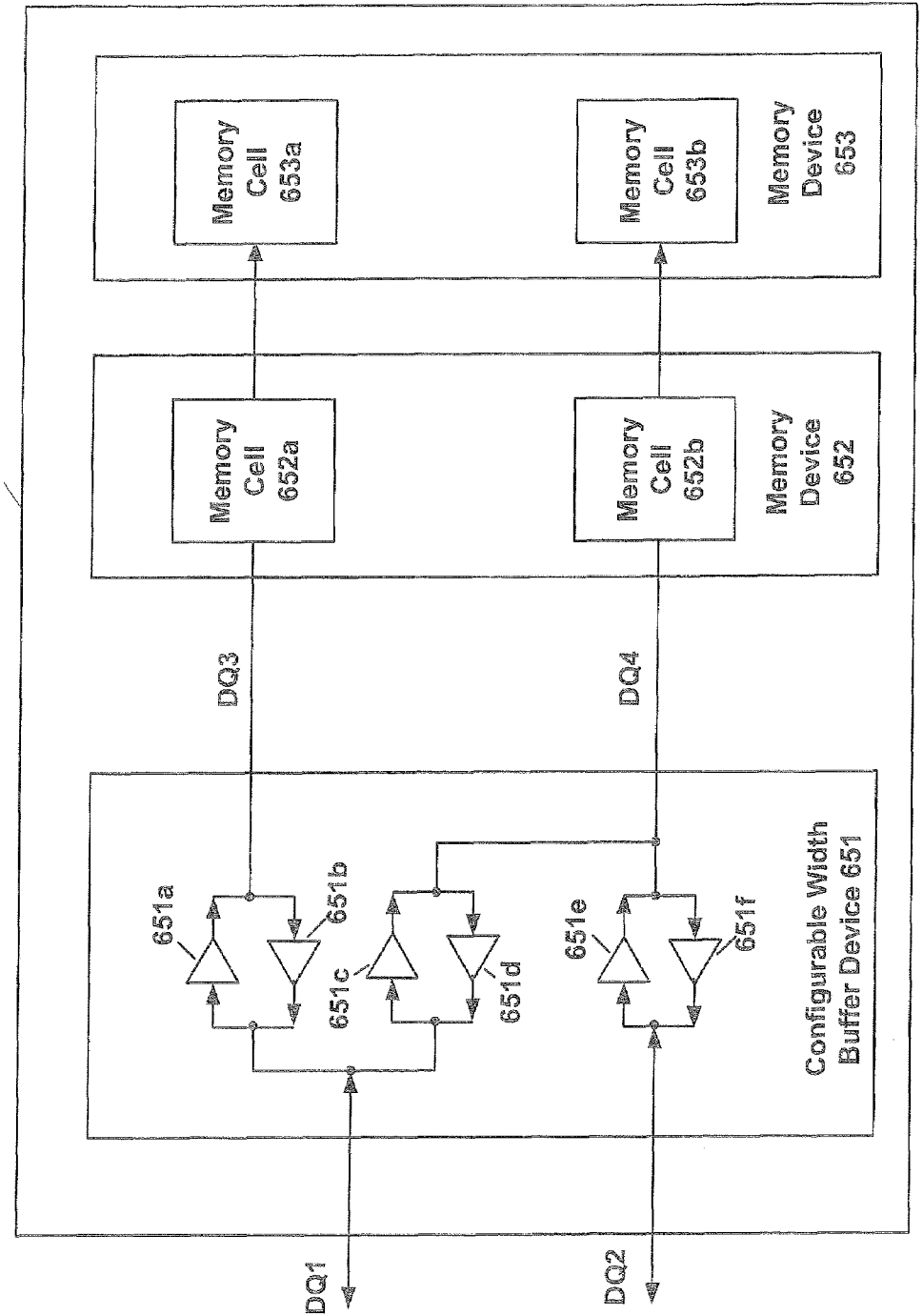
FIGS. 5E and 5F illustrate configurable width buffered modules including a configurable width buffer device coupled to memory devices according to an embodiment of the present invention.

FIG. 5E illustrates a configurable width buffered module 650 including a configurable width buffer device 651 coupled to memory devices 652 and 653 in an embodiment of the present invention. Memory devices 652 and 653 include memory cells 652*a-b* and 653*a-b*, respectively.

Channels DQ1 and DQ2 are coupled to configurable width buffered module 650 at a connector interface that includes at least a first contact and a second contact, and in particular to configurable width buffer device 651. Channels DQ1 and DQ2 include a plurality of signal lines for providing signals to and from configurable width buffered module 650. In an alternate embodiment of the present invention, a single or more channels are coupled to configurable width buffered module 650. In an embodiment of the present invention, channels DQ1 and DQ2 are coupled to a master device, such as a controller.

Channels DQ3 and DQ4 are also coupled to configurable width buffer device 651 and are positioned in configurable width buffered module 650 in an embodiment of the present invention. Channels DQ3 and DQ4 couple configurable width buffer device 651 to memory devices 652 and 653.

Channels DQ3 and DQ4 include a plurality of signal lines for providing signals to and from memory devices 652 and 653, and in particular memory cells 652a-b and 653a-b. In an alternate embodiment of the present invention, a single or more channels are coupled to memory devices 652 and 653. In alternate embodiments of the present invention, more or less memory devices are included in configurable width buffered module 650.

Configurable width buffer device 651 includes a plurality of transceiver circuits 651a-f capable of transmitting and receiving signals on channels DQ1-4. Each transceiver circuit 651a-f includes a transmitter circuit and a receiver circuit in an embodiment of the present invention. Transceiver 651a is coupled to channel DQ1 and provides signals on channel DQ3. Transceiver 651b is coupled to channel DQ3 and provides signals on channel DQ1. Transceiver 651c is coupled to channel DQ1 and provides signals on channel DQ4. Transceiver 651d is coupled to channel DQ4 and provides signals on channel DQ1. Transceiver 651e is coupled to channel DQ2 and provides signals on channel DQ4. Transceiver 651f is coupled to channel DQ4 and provides signals on channel DQ2. Both memory cells 652a and 652b are not accessed via channel DQ1 during a single access operation in an embodiment of the present invention.

In an embodiment of the present invention, configurable width buffered module 650 operates in at least two modes of operation. In a first mode of operation, memory cell 652a and memory cell 652b in memory device 652 are accessible from a first contact coupled to channel DQ1. In particular, signals are transferred between channel DQ1 and memory cell 652a by using transceiver 651a, transceiver 651b and channel DQ3. Transceiver 651a is used to write data signals to memory cell 652a and transceiver 651b is used to read data signals from memory cell 652a. Signals are transferred between channel DQ1 and memory cell 652b using transceiver 651c, transceiver 651d and channel DQ4. Transceiver 651c is used to write data signals to memory cell 652b and transceiver 651d is used to read data signals from memory cell 652b.

In a second mode of operation, memory cell 652a and memory cell 652b in memory device 652 are accessible from a first contact coupled to channel DQ1 and a second contact coupled to channel DQ2, respectively. In particular, signals are transferred between channel DQ1 and memory cell 652a by using transceiver 651a, transceiver 651b and channel DQ3. Transceiver 651a is used to write data signals to memory cell 652a and transceiver 651b is used to read data signals from memory cell 652a. Signals are transferred between channel DQ2 and memory cell 652b using transceiver 651e, transceiver 651f and channel DQ4. Transceiver 651e is used to write data signals to memory cell 652b and transceiver 651f is used to read data signals from memory cell 652b. In another embodiment of the present invention, memory device 653 is also coupled to channels DQ3 and DQ4 and includes memory cells 653a and 653b that are likewise accessible in at the two modes of operation described above.

Figure 5F:
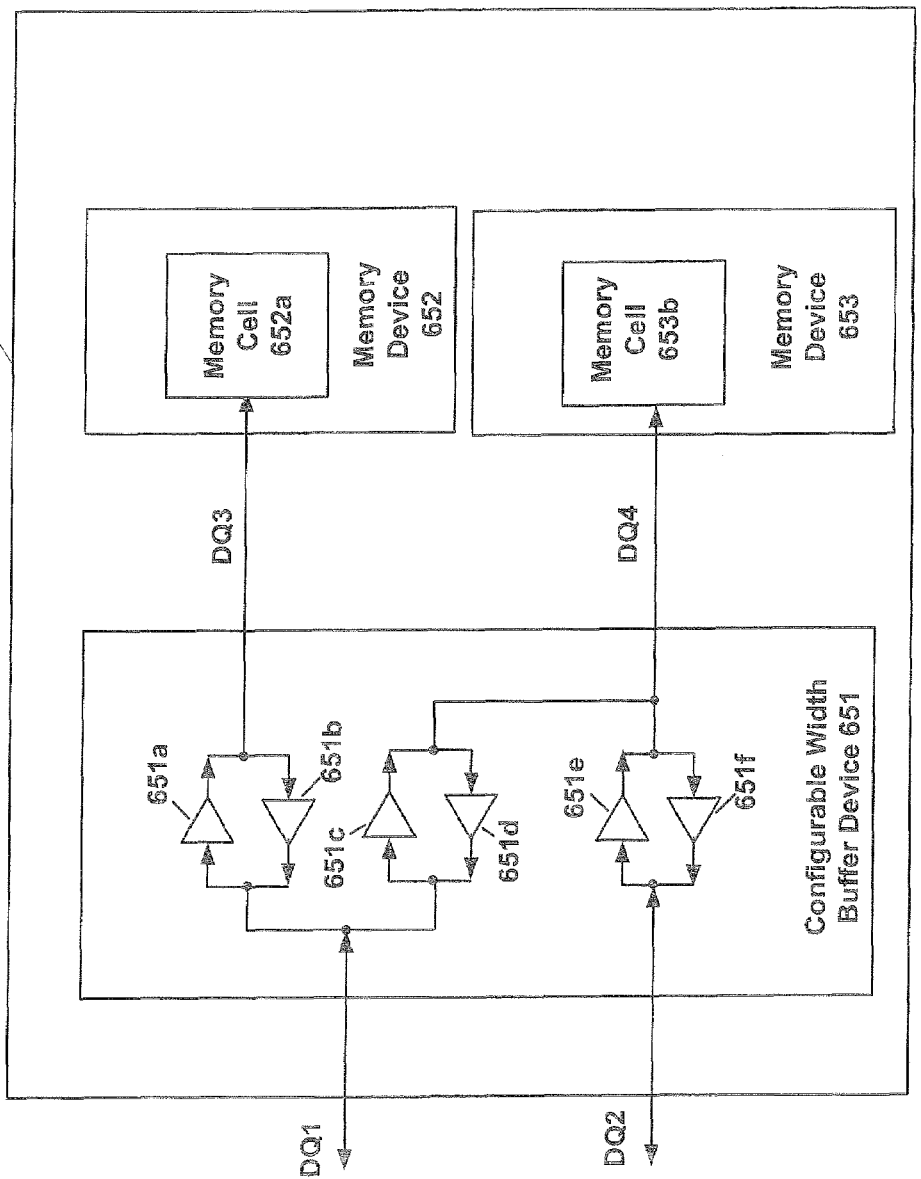

FIG. 5F illustrates a configurable width buffered module 660 where channel DQ3 is coupled to memory cell 652a in memory device 652 and channel DQ4 is coupled to memory cell 653b in memory device 653. Like referenced components shown in FIG. 5F operate and are described above in regard to FIG. 5E. In this embodiment of the present invention, Configurable width buffer device 651 accesses two memory devices that do not share channels DQ3 and DQ4. There are two modes of operation in an embodiment of the present invention. In a first mode of operation, memory cell 652a is accessed via channel DQ1 and memory cell 653b is accessed via channel DQ2. In a second mode of operation, memory cell 652a is accessed via channel DQ1 and memory cell 653b is accessed via channel DQ1. Both memory cells 652a and 653b are not accessed via channel DQ1 during a single access operation in an embodiment of the present invention. FIG. 5F conceptually illustrates accessing memory cells by a configurable width buffer device 651. In order to clearly describe the present invention, one of ordinary skill in the art would appreciate that may components used in a buffer device and memory devices are not shown, such as memory device access logic and transceivers as well as configurable width buffer device 651 logic.

According to embodiments of the present invention, subsets of available memory devices on configurable width buffered module 395 are activated or powered-on during various modes of operation. Thus, configurable width buffered module 395 is able to achieve power savings by only powering particular memory devices.

Figure 6A:
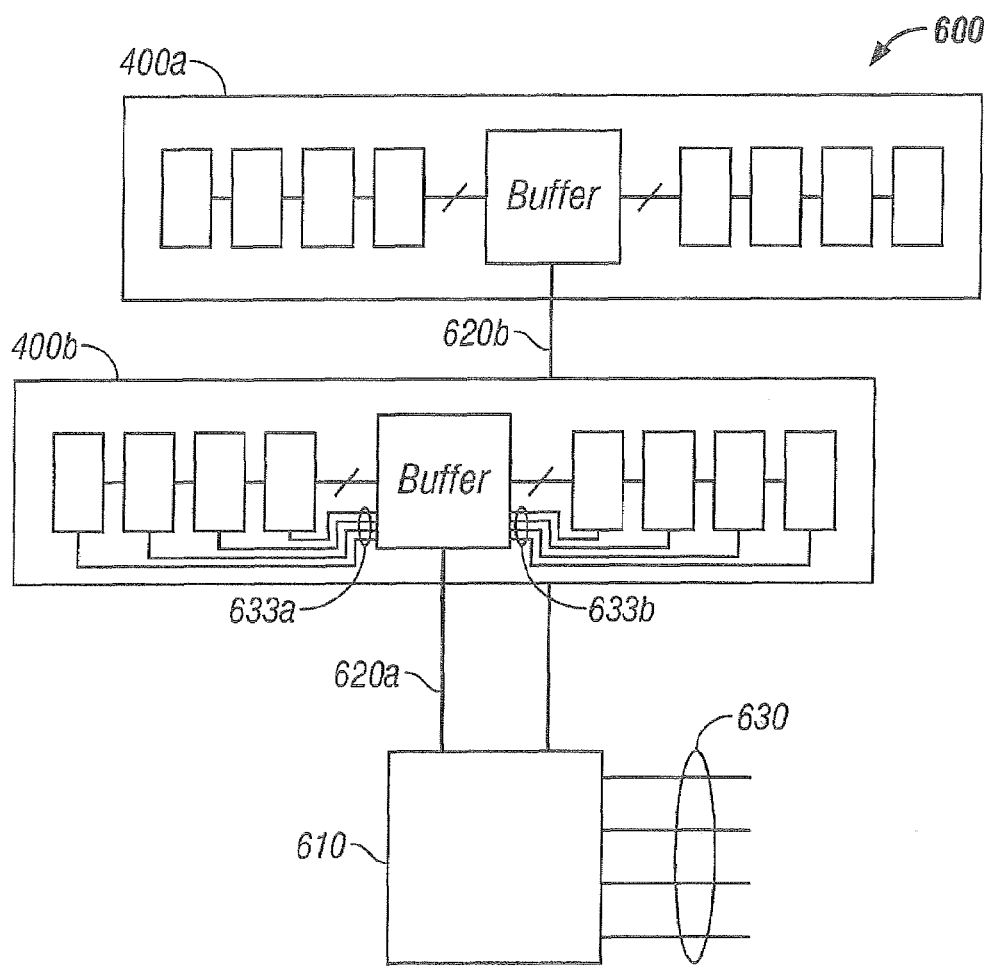
FIGS. 6A and 6B illustrate block diagrams of a memory system according to other embodiments of the present invention.
Figure 6B:
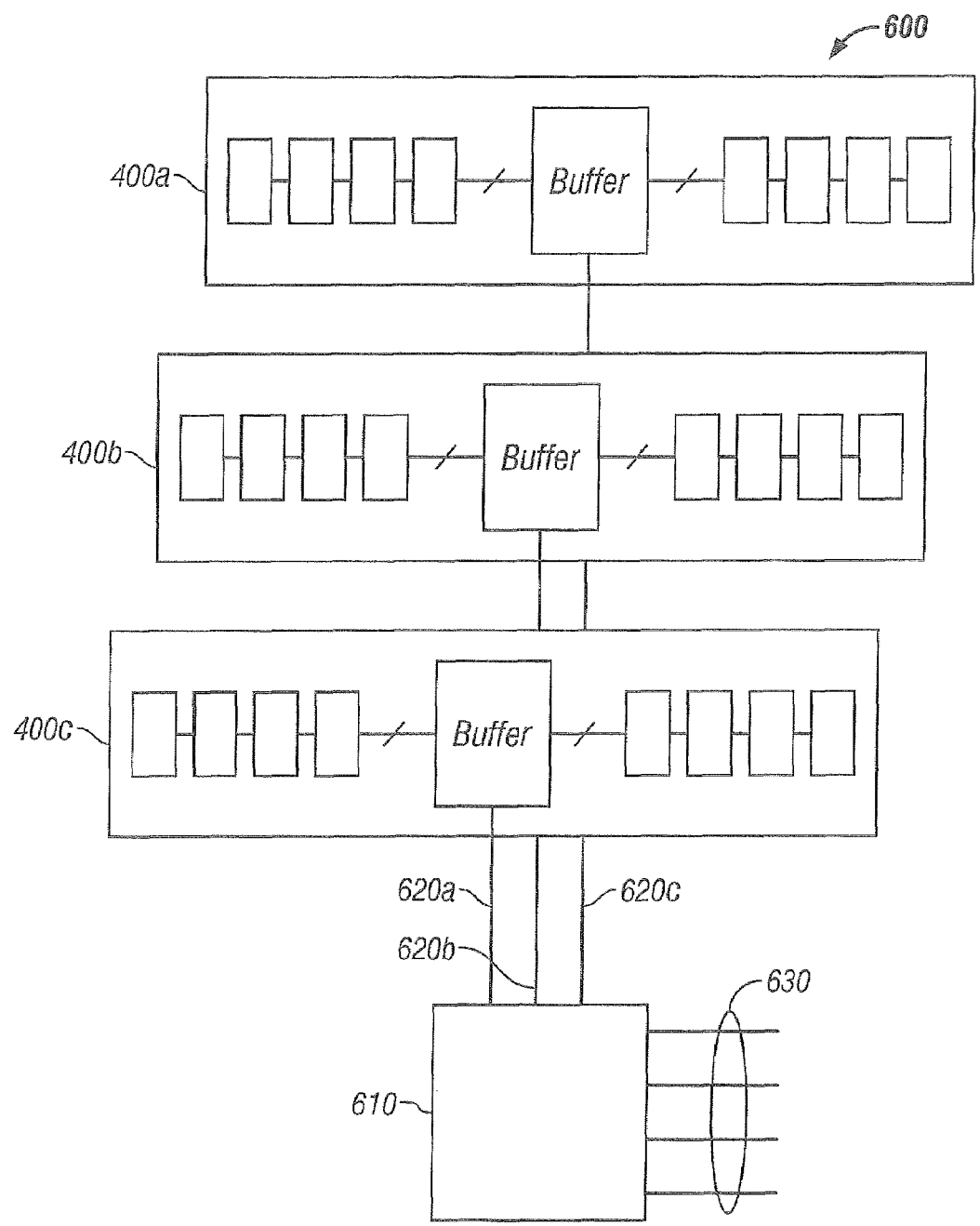

With reference to FIGS. 6A, and 6B, block diagrams of a memory system according to embodiments of the present invention are illustrated. Memory system 600 includes modules 400a and 400b, controller 610, and populated primary point-to-point links 620a and 620b. Unpopulated primary point-to-point links 630 are populated by coupling additional modules (not shown) thereto. The additional modules may be provided to upgrade memory system 600. Connectors may be disposed at an end of each primary point-to-point link to allow insertion or removal of the additional modules. Modules 400a and 400b may also be provided with a connector or may be fixedly disposed (i.e., soldered) in memory system 600. Although only two populated primary point-to-point links are shown in FIG. 6A, any number of primary point-to-point links may be disposed in memory system 600, for example, three primary point-to-point links 400a-400c, as shown in FIG. 6B.

Figure 7:
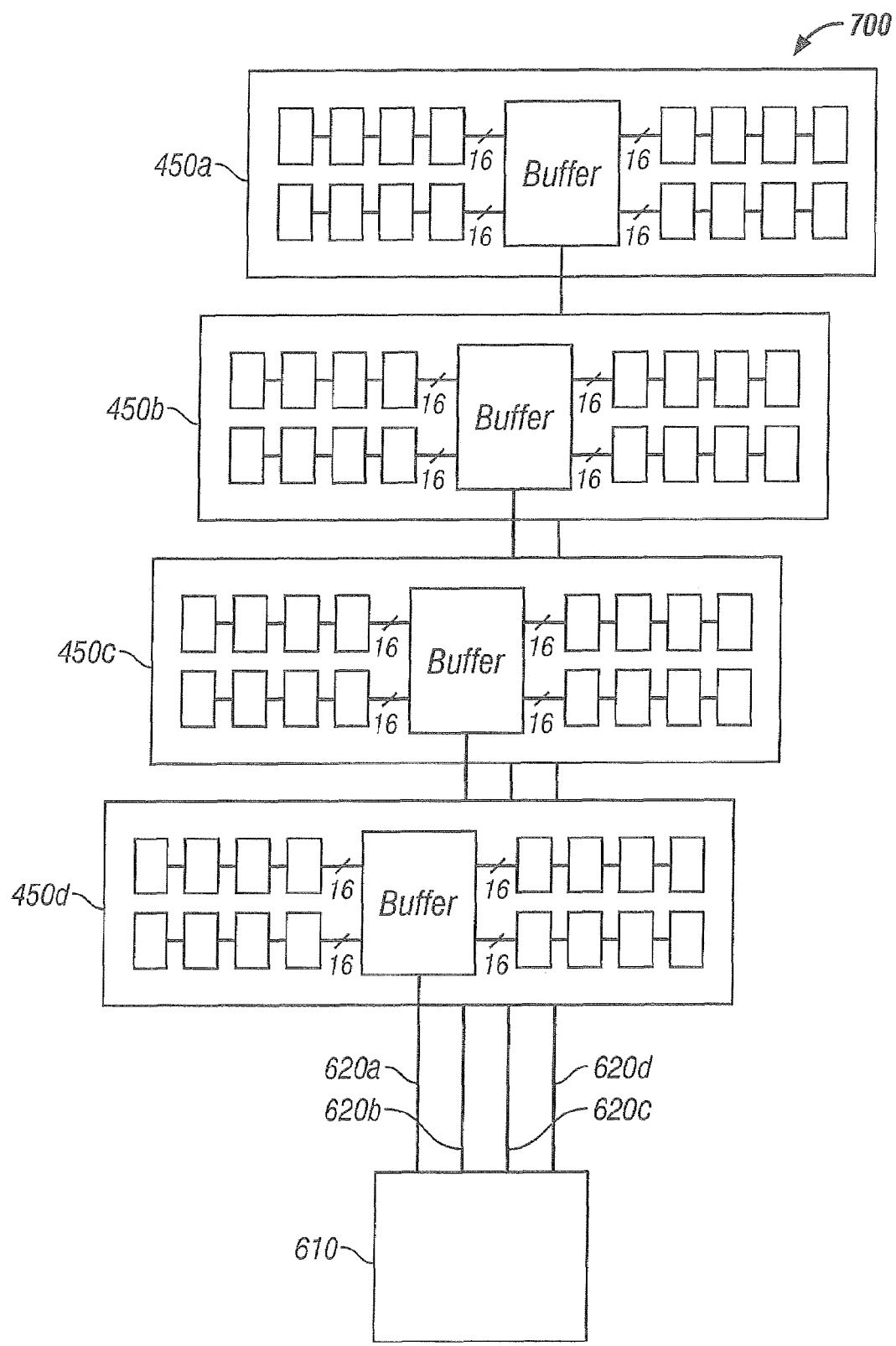
FIG. 7 illustrates a block diagram of a memory system employing a buffered quad-channel module according to an embodiment of the present invention.

With reference to FIG. 7 and FIG. 4B, a block diagram of a memory system employing a buffered quad-channel module according to an embodiment of the present invention is illustrated. Memory systems 700 incorporate quad-channel modules 450a-450d, each coupled via point-to-point links 620a-620d respectively.

Referring to FIG. 4B, buffer device 405 may operate in a bandwidth concentrator approach. By employing quad channels 415a-415d on each of modules 450a-450d, bandwidth in each module may be concentrated from all quad channels 415a-415d on each module to corresponding point-to-point links 620a-620d. In this embodiment, throughput on each of point-to-point links 620a-620d is concentrated to four times the throughput achieved on each of quad channels 415a-415d. Here, each of channels 415a-415d transfers information between one or more respective memory devices on each channel and buffer device 405 simultaneously.

Any number of channels 415a-415d, for example; two channels 415c and 415d may transfer information simultaneously and the memory devices on the other two channels 415a and 415b remain in a ready or standby state until called upon to perform memory access operations. Different applications may have different processing throughput requirements. In addition, the throughput requirements of a particular application may dynamically change during processing. Typically, more power is consumed as throughput is increased as power consumption relates in proportion to operation frequency. The amount of throughput in a system may be implemented on a dynamic throughput requirement basis to save on power consumption. In this embodiment, memory system 700 may concentrate bandwidth as it is required while in operation. For example, memory system 700 may employ only one of channels 415a-415d and match throughput to the corresponding point-to-point link. As bandwidth requirements increase, memory system 700 may dynamically activate more of channels 415a-415d and increase the throughput on the point-to-point link along with the number of channels accordingly to meet the bandwidth requirements for a given operation.

Figure 8A:
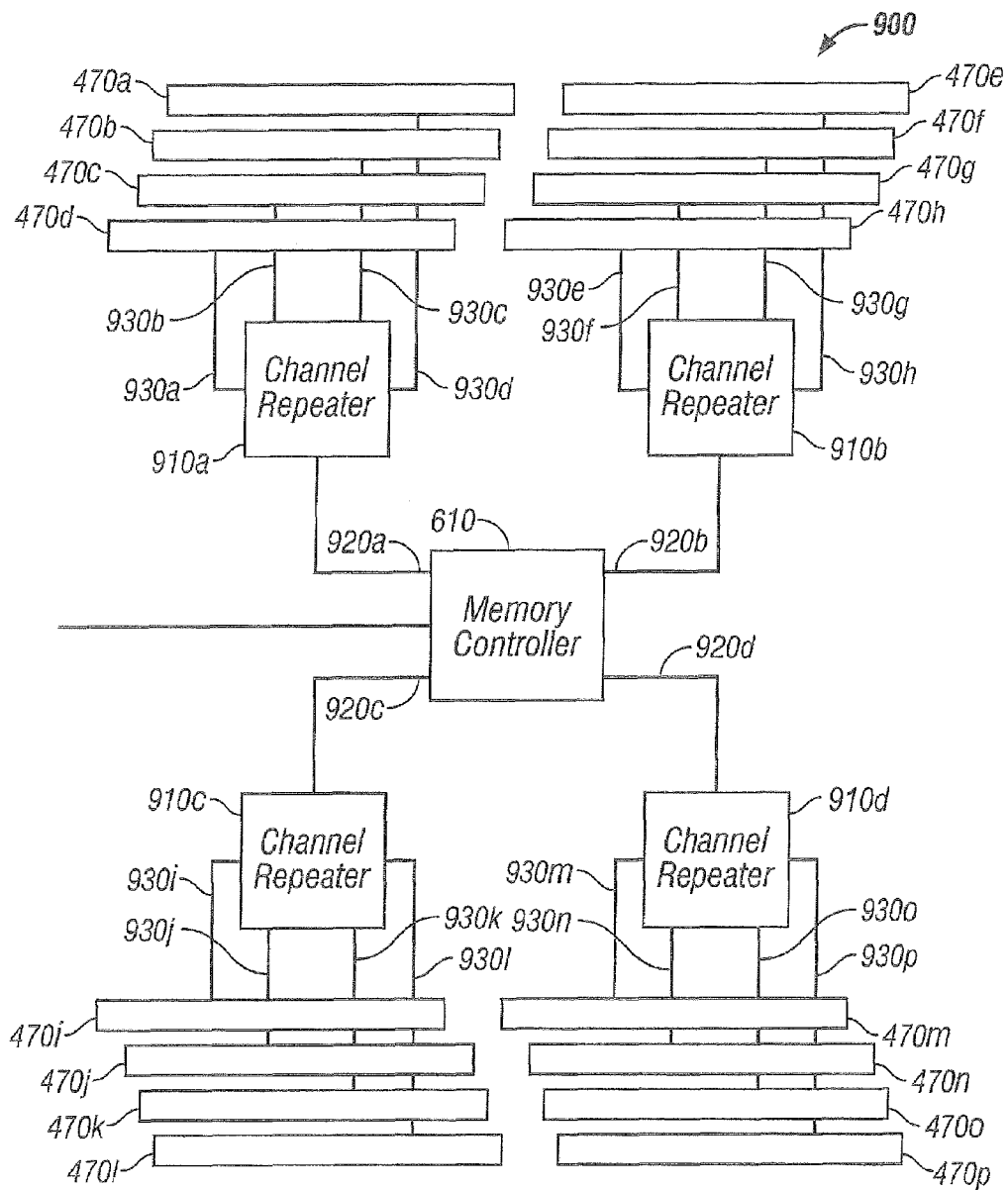
FIG. 8A illustrates a block diagram of a large capacity memory system according to another embodiment of the present invention.
Figure 8B:
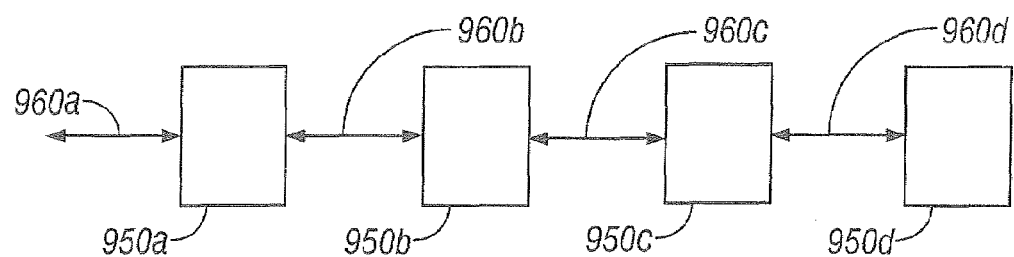
FIGS. 8B and 8C illustrate another approach utilized to expand the memory capacity of a memory system in accordance to yet another embodiment of the present invention.
Figure 8C:
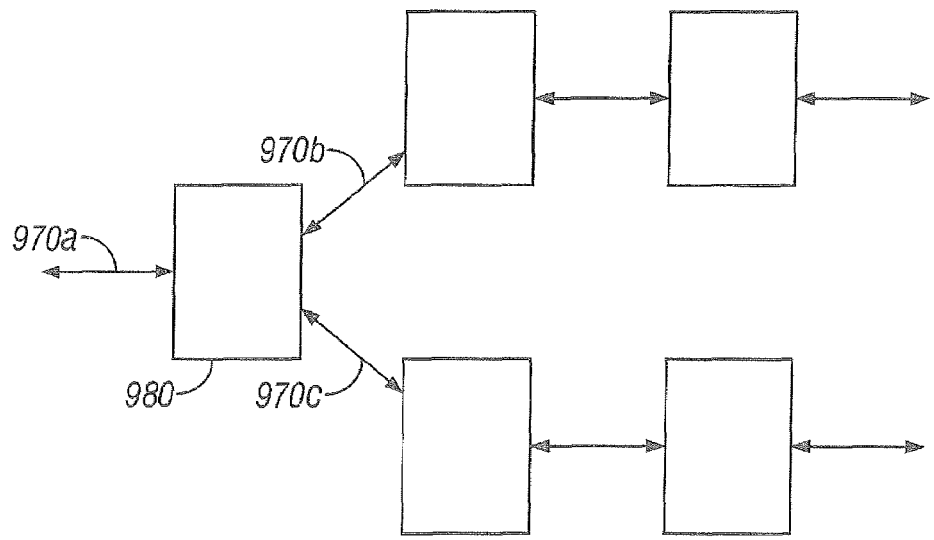

With reference to FIG. 8A, a block diagram of a large capacity memory system according to an embodiment of the present invention is illustrated. Memory system 900 includes modules 470a-470p, coupled to controller 610 via repeaters 910a-910d, primary links 920a-920d, and repeater links 930a-930p. Primary links 920a-920d provide a point-to-point link between controller 610 and a respective repeater 910a-910d. In an embodiment of the present invention, each of repeaters 910a-910d decode packets transmitted from controller 610 which are then directed over one or more, or none of repeater links 930a-d, depending the type of access required. Each repeater link 930a-930p may utilize a point-to-point link configuration. By incorporating, repeated links 930a-930p and repeaters 910a-910d, a larger number of modules may be accessed and a larger capacity memory system may be realized. Such a large capacity may be suited in a computer server system.

FIG. 8B illustrates another approach utilized to expand the memory capacity of a memory system in accordance to yet another embodiment. Here, a plurality of buffered modules 950a-950d are "daisy chained" via a plurality of point-to-point links 960a-960d to increase the overall memory capacity. Connection points of each point-to-point link are connected to two adjacent buffered modules. Each of buffered modules 950a-950c transceive signals between adjacent point-to-point links 960a-960d. Point-to-point link 960a may be coupled to a controller or another buffered module. Additional point-to-point links may be coupled to a buffer device in a tree configuration approach. For example, three point-to-point links 970a-970c each having a single end connected to one buffer device 980 may be employed as shown in FIG. 8C.

Other point-to-point topologies include a "ring" in which a plurality of buffered modules are connected in a ring by a respective plurality of point-to-point links and a "star" where a plurality of memory modules are connected to a center memory module by a respective plurality of point-to-point links.

In various embodiment of the present invention, point-to-point links are unidirectional, bidirectional or a combination thereof. A unidirectional link transfers a signal in a single direction to or from a connection point. A bidirectional link transfers signals both to and from a connection point.

While this invention has been described in conjunction with what is presently considered the most practical embodiments, the invention is not limited to the disclosed embodiments. In the contrary, the embodiments disclosed cover various modifications that are within the scope of the invention as set forth in the following claims.

What is claimed is:

1. A circuit board comprising:
   a bus to transport control information; and
   a plurality of memory subsystems, coupled to the bus, wherein each memory subsystem of the plurality of memory subsystems includes:
      an integrated circuit buffer device comprising:
         a port to receive the control information from the bus; and
         a point-to-point link port to receive data, wherein the point-to-point link port includes a configurable width; and
      a plurality of integrated circuit memory devices to receive the data and control information from the integrated circuit buffer device and store the data in response to the control information.

2. The circuit board of claim 1, wherein the plurality of integrated circuit memory devices includes flash memory devices.

3. The circuit board of claim 1, wherein each integrated circuit memory device of the plurality of integrated circuit memory devices is a double data rate synchronous dynamic random access memory device.

4. The circuit board of claim 1, wherein the plurality of integrated circuit memory devices is stacked on top of the integrated circuit buffer device.

5. The circuit board of claim 4, further comprising:
   flexible tape interconnect that interconnects the plurality of integrated circuit memory devices and the integrated circuit buffer device.

6. The circuit board of claim 1, further comprising a plurality of bidirectional point-to-point links coupled to the plurality of memory subsystems, wherein each memory subsystem of the plurality of memory subsystems includes a corresponding bidirectional point-to-point link of the plurality of bidirectional point-to-point links connected to the point-to-point link port of the integrated circuit buffer device.

7. The circuit board of claim 6, further comprising an integrated circuit controller connected to the bus and each bidirectional point-to-point link of the plurality of bidirectional point-to-point links, the integrated circuit controller to provide the control information to the bus and the data to the plurality of bidirectional point-to-point links.

8. The circuit board of claim 7, further comprising:
   the integrated circuit controller to provide address information to the bus, wherein the address information specifies where to store the data in the plurality of integrated circuit memory devices.

9. The circuit board of claim 1, wherein the control information is transported on the bus using a first protocol, wherein the integrated circuit buffer device translates the control information such that the control information is provided to the plurality of integrated circuit memory devices using a second protocol.

10. A system comprising:
   an integrated circuit controller device to generate control information;
   a bus, coupled to the integrated circuit controller device, to transport the control information;
   a first integrated circuit buffer device coupled to the bus, the first integrated circuit buffer device to receive the control information from the bus, the first integrated circuit buffer device includes a configurable width interface;
   a first plurality of integrated circuit memory devices coupled to the first integrated circuit buffer device, wherein, in response to the control information, first data is transferred between the first plurality of integrated circuit memory devices and the first integrated circuit buffer device;
   a first point-to-point link coupled to the first integrated circuit buffer device and the integrated circuit controller device, the first point-to-point link to transport the first data between the first integrated circuit buffer device and the integrated circuit controller device;
   a second integrated circuit buffer device coupled to the bus, the second integrated circuit buffer device to receive the control information from the bus;

a second plurality of integrated circuit memory devices coupled to the second integrated circuit buffer device, wherein, in response to the control information, second data is transferred between the second plurality of integrated circuit memory devices and the second integrated circuit buffer device; and a second point-to-point link coupled to the second integrated circuit buffer device and the integrated circuit controller device, the second point-to-point link to transport the second data between the second integrated circuit buffer device and the integrated circuit controller device.

11. The system of claim 10, wherein:

the first point-to-point link includes a first plurality of signal lines, wherein the transporting of the first data between the first integrated circuit buffer device and the integrated circuit controller device is bidirectional over the first plurality of signal lines; and the second point-to-point link includes a second plurality of signal lines, wherein the transporting of the second data between the second integrated circuit buffer device and the integrated circuit controller device is bidirectional over the second plurality of signal lines.

12. The system of claim 11, wherein:

bandwidth of the first data transported over the first plurality of signal lines matches bandwidth of the first data transferred between the first plurality of integrated circuit memory devices and the first integrated circuit buffer device; and bandwidth of the second data transported over the second plurality of signal lines matches bandwidth of the second data transferred between the second plurality of integrated circuit memory devices and the second integrated circuit buffer device.

13. The system of claim 10, wherein:

the first plurality of integrated circuit memory devices and the first integrated circuit buffer device are included on a first memory module; and the second plurality of integrated circuit memory devices and the second integrated circuit buffer device are included on a second memory module.

14. The system of claim 10, wherein the first integrated circuit buffer device, second integrated circuit buffer device, first plurality of integrated circuit memory devices, and second plurality of integrated circuit memory devices are all disposed on a common circuit board substrate.

15. The system of claim 14, wherein the integrated circuit controller device is disposed on the common circuit board substrate.

16. A system comprising:

an integrated circuit controller device having a plurality of ports;

a bus coupled to the integrated circuit controller device, the bus to transport control information generated by the integrated circuit controller device; and a plurality of memory subsystems, coupled to the bus, to receive the control information, wherein each memory subsystem of the plurality of memory subsystems includes:

a plurality of integrated circuit memory devices configured to output data; and an integrated circuit buffer device including:

a first port to receive the control information from the bus;

a second port to provide the control information to the plurality of integrated circuit memory devices, wherein the plurality of integrated circuit memory devices are configured to output the data in response to the control information;

a third port to receive the data from the plurality of integrated circuit memory devices; and a fourth port to output the data to a corresponding port of the plurality of ports included on the integrated circuit controller device, wherein the fourth port of the integrated circuit buffer device includes a configurable width.

17. The system of claim 16, wherein the plurality of memory subsystems and the integrated circuit controller device are disposed on a circuit board substrate.

18. The system of claim 16, further including a plurality of circuit board substrates, wherein each memory subsystem of the plurality of memory subsystems is disposed on a corresponding circuit board substrate of the plurality of circuit board substrates.

19. The system of claim 16, wherein each integrated circuit buffer device includes a multiplexer, coupled to the third port, to receive the data from the plurality of integrated circuit memory devices and to provide, as output on the fourth port, the data in a serialized format.

20. The system of claim 16, wherein each memory subsystem of the plurality of memory subsystems further comprises a plurality of channels to transport the data between the plurality of integrated circuit memory devices and the integrated circuit buffer device, wherein address information transmitted from the integrated circuit controller device to the first port of the buffer device via the bus is used to determine subsets of channels of the plurality of channels used to transport the data between the plurality of integrated circuit memory devices and the integrated circuit buffer device.

21. A system comprising:

an integrated circuit controller device;

a bus coupled to the integrated circuit controller device, the bus to transport control information generated by the integrated circuit controller device; and a plurality of integrated circuit buffer devices, coupled to the bus, to receive the control information from the bus, wherein each integrated circuit buffer device of the plurality of integrated circuit buffer devices includes:

a first port to receive data output from the integrated circuit controller device, wherein the first port of the integrated circuit buffer device is included in a configurable width interface;

a second port to provide the control information and a first portion of the data to a first plurality of memory devices; and a third port to provide the control information and a second portion of the data to a second plurality of memory devices.

22. A circuit board comprising:

a plurality of memory subsystems, coupled to a bus, to receive control information from the bus, wherein each memory subsystem of the plurality of memory subsystems includes:

an integrated circuit buffer device to receive the control information from the bus, wherein the integrated circuit buffer device includes a configurable width to transfer data;

a first integrated circuit memory device;

a second integrated circuit memory device;

a first plurality of signal lines coupled to the first integrated circuit memory device and the integrated circuit buffer device, the first plurality of signal lines to transport first data between the first integrated circuit memory device and the integrated circuit buffer device;

a first set of control lines coupled to the first integrated circuit memory device and the integrated circuit buffer device, the first set of control lines to provide the control information received by the integrated circuit buffer device to the first integrated circuit memory device;

a second plurality of signal lines coupled to the second integrated circuit memory device and the integrated circuit buffer device, the second plurality of signal lines to transport second data between the second integrated circuit memory device and the integrated circuit buffer device; and a second set of control lines coupled to the second integrated circuit memory device and the integrated circuit buffer device, the second set of control lines to provide the control information received by the integrated circuit buffer device to the second integrated circuit memory device.

23. The circuit board of claim 22, further comprising a plurality of point-to-point links to transport data, each link of the plurality of point-to-point links having:

a first end connected to an integrated circuit controller; and a second end connected to a corresponding integrated circuit buffer device included in each memory subsystem of the plurality of memory subsystems.

24. The circuit board of claim 22, wherein each of the first integrated circuit memory device and the second integrated circuit memory device includes dynamic random access memory cells.

* * * * *